(12) United States Patent
Tsuboyama et al.

(10) Patent No.: US 7,875,366 B2
(45) Date of Patent: Jan. 25, 2011

(54) LUMINESCENT DEVICE

(75) Inventors: Akira Tsuboyama, Machida (JP); Jun Kamatani, Tokyo (JP); Manabu Furugori, Machida (JP); Shinjiro Okada, Kamakura (JP); Takao Takiguchi, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 974 days.

(21) Appl. No.: 10/577,160

(22) PCT Filed: Nov. 16, 2004

(86) PCT No.: PCT/JP2004/017331
§ 371 (c)(1),
(2), (4) Date: Apr. 26, 2006

(87) PCT Pub. No.: WO2005/054404
PCT Pub. Date: Jun. 16, 2005

(65) Prior Publication Data
US 2007/0072001 A1     Mar. 29, 2007

(30) Foreign Application Priority Data

Dec. 1, 2003  (JP) .............................. 2003-401821
Oct. 13, 2004  (JP) .............................. 2004-298501

(51) Int. Cl.
*H01L 51/54*   (2006.01)
*C09K 11/06*   (2006.01)

(52) U.S. Cl. ....................... 428/690; 428/917; 313/504; 313/506; 252/301.16; 257/40; 257/102; 257/E51.044; 546/2

(58) Field of Classification Search ........................ None
See application file for complete search history.

(56) References Cited

U.S. PATENT DOCUMENTS

| 4,769,292 | A | 9/1988 | Tang et al. ................... 428/690 |
| 2001/0019782 | A1* | 9/2001 | Igarashi et al. ............... 428/690 |
| 2002/0064684 | A1 | 5/2002 | Seo ............................ 428/690 |
| 2005/0014024 | A1 | 1/2005 | Tsuboyama et al. ......... 428/690 |
| 2005/0079384 | A1 | 4/2005 | Tsuboyama et al. ......... 428/690 |
| 2005/0221115 | A1 | 10/2005 | Tsuboyama et al. ......... 428/690 |

FOREIGN PATENT DOCUMENTS

| JP | 63-264692 | 11/1988 |
| JP | 10-308277 | 11/1998 |
| JP | 2002-231454 | 8/2002 |

OTHER PUBLICATIONS

Kukhto "Electroluminescence of thin films of organic compounds (Review)" Journal of Applied Spectroscopy, vol. 70, No. 2, 2003 pp. 165-176.*
Skoog et al. "Principles of Instrumental Analysis" Saunders College, second edition, 1980, pp. 280-289.*
Yam et al., "Photophysics and photochemical . . . organocopper (I) complexes"; J. Chem. Coc. Dalton Trans. (1996) pp. 2889-2891.
Hitchock et al., "Spectroscopic and electronic properties of . . . complexes", J. Chem. Soc., Dalton Trans. (1999), 1455-1459.
Pal et al., "A Novel double-stranded dinuclear . . . chromophore", Chem. Comm., vol. 3, No. 11, 585-598 (2000).
Sorrell, et al., :Synthesis, Structure Having Imidazole Ligands, J.A.C.S., vol. 109, No. 14, 4255-4260 (1987).
Juris, et al., "Photophysical properties of . . . complexes", Inorg. Chimica Acta; vol. 225, No. 1-2; 251-254 (1994).
Engelhardt, L.M., et al., "Synthesis and Structure of Copper (I), Silver (I) and Zinc(II) Amides [Cu$_2$(mpsa)$_2$], [Cu$_6$X$_2$(mpsa)$_4$](X=Cl or Br), [Ag$_4$(mpsa)$_4$] and [(ZnEt)$_2$ (mpsa)$_2$] [mpsa=2-N(SiMe$_3$)-C$_5$H$_3$-N-6-Me]", J. Chem. Soc. Dalton Trans., pp. 2859-2868 (1991).
Ma, Y., et al., "High Luminescence Gold(I) and Copper(I) Complexes with a Triplet Excited State for Use in Light-Emitting Diodes", Advanced Materials, 11, No. 10, pp. 852-857 (1999).
van den Ancker, T.R., et al., "Syntheses and crystal structures of binuclear gold (I), silver(I) and copper(I) complexes containing bulky pyridyl functionalised alkyl ligands", J. Chem. Soc. Dalton Trans., pp. 3069-3072 (2001).
Dias, H.V.R., et al., "Bright Phosphorescence of a Trinuclear Copper(I) Complex: Luminescence Thermochromism, Solvatochromism, and "Concentration Luminochromism"" J. Am. Chem. Soc. 125, pp. 12072-12073, (2003).
Dyke, A.F., et al., "Organic Chemistry of Dinuclear Metal Centres. Part 3μ-Carbene Complexes of Iron and Ruthenium from Alkynes*via* μ-Vinyl Cations", J. Chem. Soc. Dalton Trans. pp. 1417-1426 (1983).
Chen, C.H., et al., "Recent Developments in Molecular Organic Electroluminescent Materials", Macromolecular Symposia, 125, pp. 1-48 (1997).

* cited by examiner

*Primary Examiner*—D. Lawrence Tarazano
*Assistant Examiner*—Michael Wilson
(74) *Attorney, Agent, or Firm*—Fitzpatrick, Cella, Harper & Scinto

(57) ABSTRACT

The present invention provides a luminescent device using a luminescent material which has high luminescence efficiency and high stability, and is available at a low cost. The luminescent device is characterized in that as a luminescent material is used a binuclear copper coordination compound having a partial structure represented by the general formula (1): Cu-A-Cu, wherein Cu is a copper ion and A is a bidentate ligand.

1 Claim, 3 Drawing Sheets

LUMINESCENT DEVICE

TECHNICAL FIELD

The present invention relates to a luminescent device using an organic compound, more particularly to a luminescent device exhibiting stability and high efficiency which is provided by using a metal coordination compound as a luminescent material.

BACKGROUND ART

Organic EL devices as luminescent devices with high-speed response and high efficiency have been intensively investigated for their application (see Macromol. Symp. 125, 1-48 (1997), for example).

A copper coordination compound can be produced at a relatively low cost due to inexpensive raw materials, and low-cost and high performance organic EL devices can be obtained when performance of the copper coordination compound is fully utilized.

Organic EL devices using copper coordination compounds are disclosed in Japanese Patent No. 2940514 and Advanced materials 1999 11 No. 10 p. 852 Y. Ma et al. However, these EL devices have remarkably low luminescence efficiency, and these documents have insufficient description of device efficiency. It is difficult to consider that the properties of the copper coordination compounds are fully exploited. Thus, these EL devices do not have enough performance to be used for displaying or lighting.

In addition, a luminescent material of a copper coordination compound used in Advanced materials 1999 11 No. 10 p. 852 Y. Ma et al. has a molecular weight of 1,600 or more, and its molecular weight is so large that the material has inferior sublimation, thus making the material unsuitable for vacuum evaporation.

Further, copper coordination compounds having the same structure as some of the compounds used in the present invention are disclosed in Journal of chemical Society Dalton Transaction 1991 p. 2859; Journal of Chemical Society Dalton Transaction 1983 p. 1419; and Journal of Chemical Society Dalton Transaction 2001 p. 3069, but there is no description concerning luminescence therein.

In Journal of American Chemical Society, 2003 125(40) p. 12072, there is a description of a trinuclear copper coordination compound different from the copper coordination compound of the present invention. The compound described therein has luminescence property, and application of the compound to an organic LED is suggested therein. The distance between copper atoms in the molecular of the compound is about 3.22 Å, and interaction between copper atoms is not strong. This trinuclear copper coordination compound can be vapor-deposited, but has inferior luminescence property (efficiency) and stability for a device.

DISCLOSURE OF THE INVENTION

It is an object of the present invention to provide a luminescent device using a luminescent material, which has high luminescence efficiency and high stability, and is available at a low cost.

Namely, a luminescent device of the present invention uses as a luminescent material a binuclear copper coordination compound having a partial structure represented by the following general formula (1). Further, the above-described copper coordination compound preferably has a partial structure represented by the following general formulae (2) and (3).

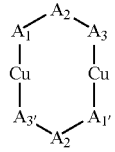

[Chemical Formula 1]

(1)

wherein Cu is a monovalent copper ion; and each of $A_1$ to $A_3$ and $A_{1'}$ to $A_{3'}$ is selected from the group consisting of a nitrogen atom, a carbon atom, and a phosphorus atom.

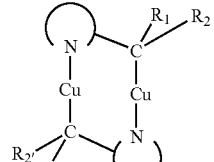

[Chemical Formula 2]

(2)

wherein each of $R_1$, $R_2$, $R_{1'}$, and $R_{2'}$ is a branched or straight alkyl group in which a hydrogen atom is optionally substituted by a halogen and which has 10 or less carbon atoms, an aromatic ring group optionally having a substituent, a trimethylsilyl group, a dialkylamino group which is optionally substituted, or a diarylamino group; each of $R_1$, $R_2$, $R_{1'}$ and $R_{2'}$ may be the same or different; and N is an imine group on a heteroaromatic ring, and the heteroaromatic ring is selected from the group consisting of a pyridine ring, a pyridazine ring, a pyrazine ring, a pyrimidine ring, a quinoline ring, an isoquinoline ring, a pyrazole ring, an azaquinoline ring, and an azaisoquinoline ring, and these rings may have a substituent.

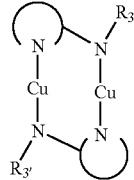

[Chemical Formula 3]

(3)

wherein each of $R_3$ and $R_{3'}$ is a branched or straight alkyl group in which a hydrogen atom is optionally substituted by a halogen and which has 10 or less carbon atoms, an aromatic ring group optionally having a substituent, and a trimethylsilyl group; each of $R_3$ and $R_{3'}$ may be the same or different; and N is an imine group in a heteroaromatic ring, and the heteroaromatic ring is selected from the group consisting of a pyridine ring, a pyridazine-ring, a pyrazine ring, a pyrimidine ring, a quinoline ring, an isoquinoline ring, a pyrazole ring, an azaquinoline ring, and an azaisoquinoline ring, and these rings may have a substituent.

Another luminescent device of the present invention uses as a luminescent material a trinuclear copper coordination compound having a partial structure represented by the following general formula (4). Further, the copper coordination compound preferably has a partial structure represented by the following general formula (5).

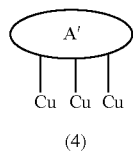

[Chemical Formula 4]

(4)

wherein Cu is a copper ion and A' is a tridentate ligand.

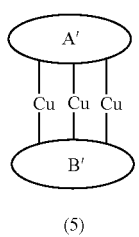

[Chemical Formula 5]

(5)

wherein B' is a tridentate ligand and may be the same as or different from A'.

In the above luminescent device of the present invention, the copper coordination compound preferably has a partial structure represented by the following general formula (6).

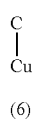

[Chemical Formula 6]

(6)

Further, it is preferable that the distance between copper atoms of the copper coordination compound is 3.2Ω or less.

Furthermore, it is preferable that the copper of copper coordination compound is a monovalent ion.

Moreover, it is preferable that a luminescent layer contains a part of 100% of the copper coordination compound.

BEST MODE FOR CARRYING OUT THE INVENTION

Figure 1A:
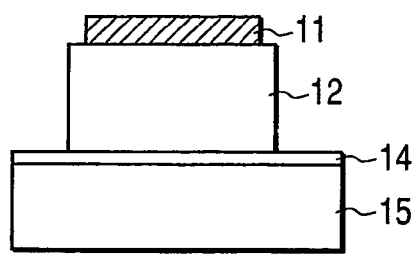
FIGS. 1A, 1B, 1C, 1D and 1E are cross sectional views showing one example of a luminescent device of the present invention.

A copper coordination compound used in the present invention not only has high luminescence efficiency but also is suitable for vacuum deposition process or spin coating process wherein the compound is applied in a solution, or application method using an ink jet nozzle, thereby enabling stable device fabrication with no damage such as decomposition in a device fabrication process. Therefore, the luminescent device of the present invention exhibits high luminescence efficiency and high stability, and at the same time can be fabricated at a low cost.

Now, the present invention will be described in detail.

First, features or a copper coordination compound are described which is a luminescent material of the present invention.

The copper coordination compound used in the present invention is a copper coordination compound having a partial structure represented by the above general formulae (1) to (4), that is a binuclear copper coordination compound wherein two copper atoms are coupled to one or a plurality of bidentate ligands, or a trinuclear copper coordination compound wherein three copper atoms are coupled to one or a plurality of tridentate ligands. The copper coordination compounds falling within this category exhibit thermal stability and high luminescence efficiency and are suitable for luminescent material. Particularly in a solid powder state, they are characterized by stronger luminescence exhibited compared with other compounds.

In general, even among compounds that exhibit strong luminescence in a dilute solution, many of them exhibit extremely weak luminescence in a solid powder state. These compounds form associations in the ground state by interaction between molecules of the luminescent material or form exciplexes, this phenomenon is known as "concentration quenching" wherein original luminescence characteristic cannot be obtained.

It can be said that a Cu coordination compound of the present invention is less susceptible to the concentration quenching. Therefore, when considering a luminescent layer in a luminescent device, the concentration quenching is generally prevented by adding a small amount of luminescent material as a guest material to a host material. However, since the copper coordination compound of the present invention has no constraint of the concentration quenching, a high concentration of the compound can be applied or a luminescent layer of 100% of the compound can be formed. As a result, luminescent devices which have high luminescence efficiency and good productivity can be fabricated. In addition, because of small concentration dependency of luminescence characteristic, variations in fabrication can be reduced. In this view, luminescent devices with high productivity can be fabricated.

Here, it is preferable to use a copper ion of a center metal that is a monovalent cation. Considering electron arrangement of a copper atom, a positive monovalent copper contains 10 d-electrons. In general, there are many cases wherein a transition metal having even number of d electrons exhibits excellent luminescence characteristic.

In addition, vacuum deposition method is commonly employed for fabricating an organic LED device in general since it enables the fabrication of a stable thin film with good quality. From our experiments, as the molecular weight of a compound becomes large, this deposition method cannot be employed. Accordingly, for vacuum deposition, the copper coordination compound of the present invention has a molecular weight of preferably 1,500 or less, more preferably 1,200 or less.

Chemical formulae of ligands that can be used for the present invention are shown below (it should be noted that the following basic structures optionally have a condensed ring group or a substituent group. The substituent group is a halogen atom, a straight, branched or cyclic alkyl group or an aromatic ring group optionally having a substituent. $CH_2$ group of the alkyl group may be substituted with —O— or —NR— (R is an alkyl group or an aromatic ring group which may be substituted), and a hydrogen atom of the alkyl group may be substituted with an aromatic ring group or a halogen atom.).

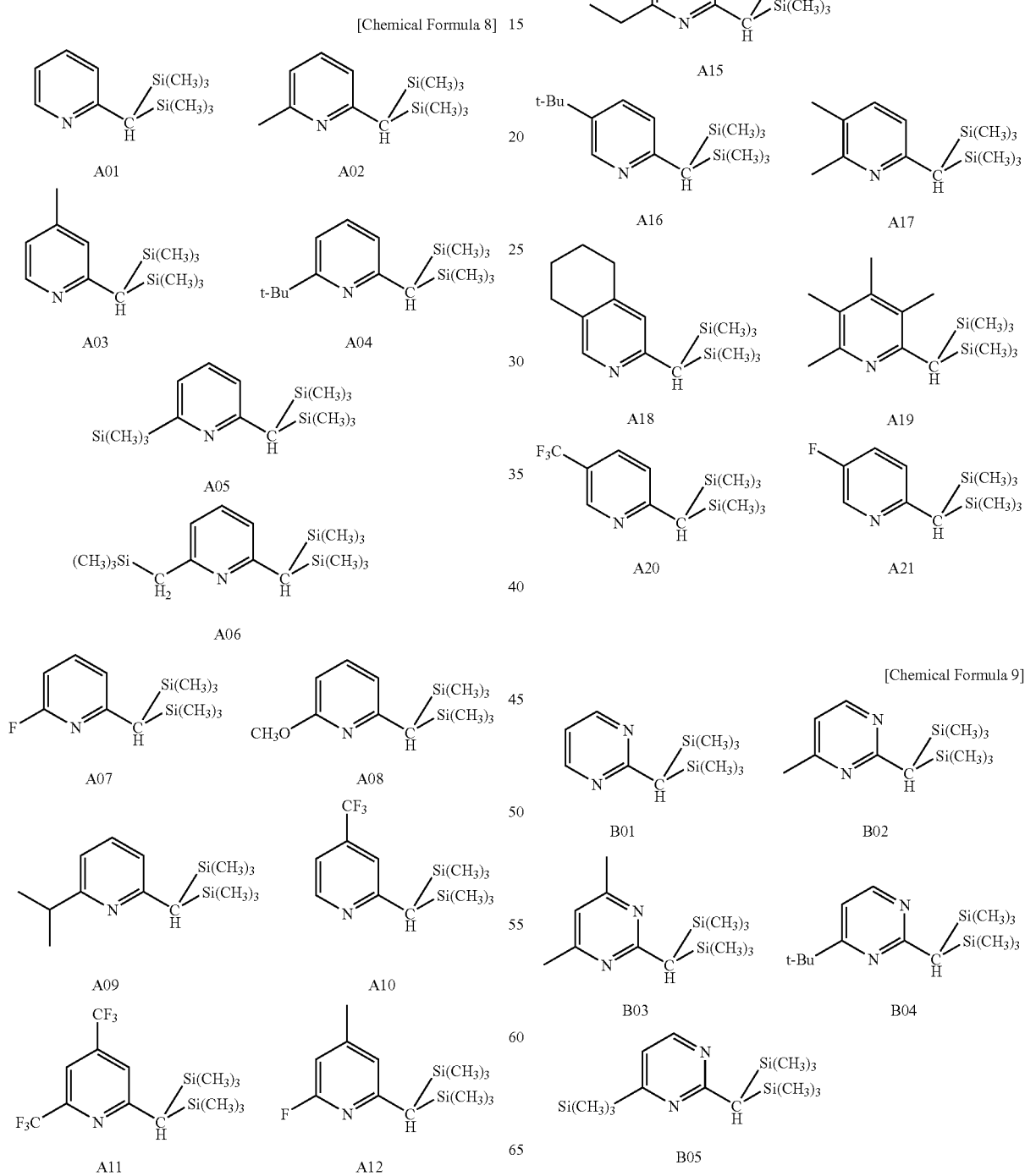

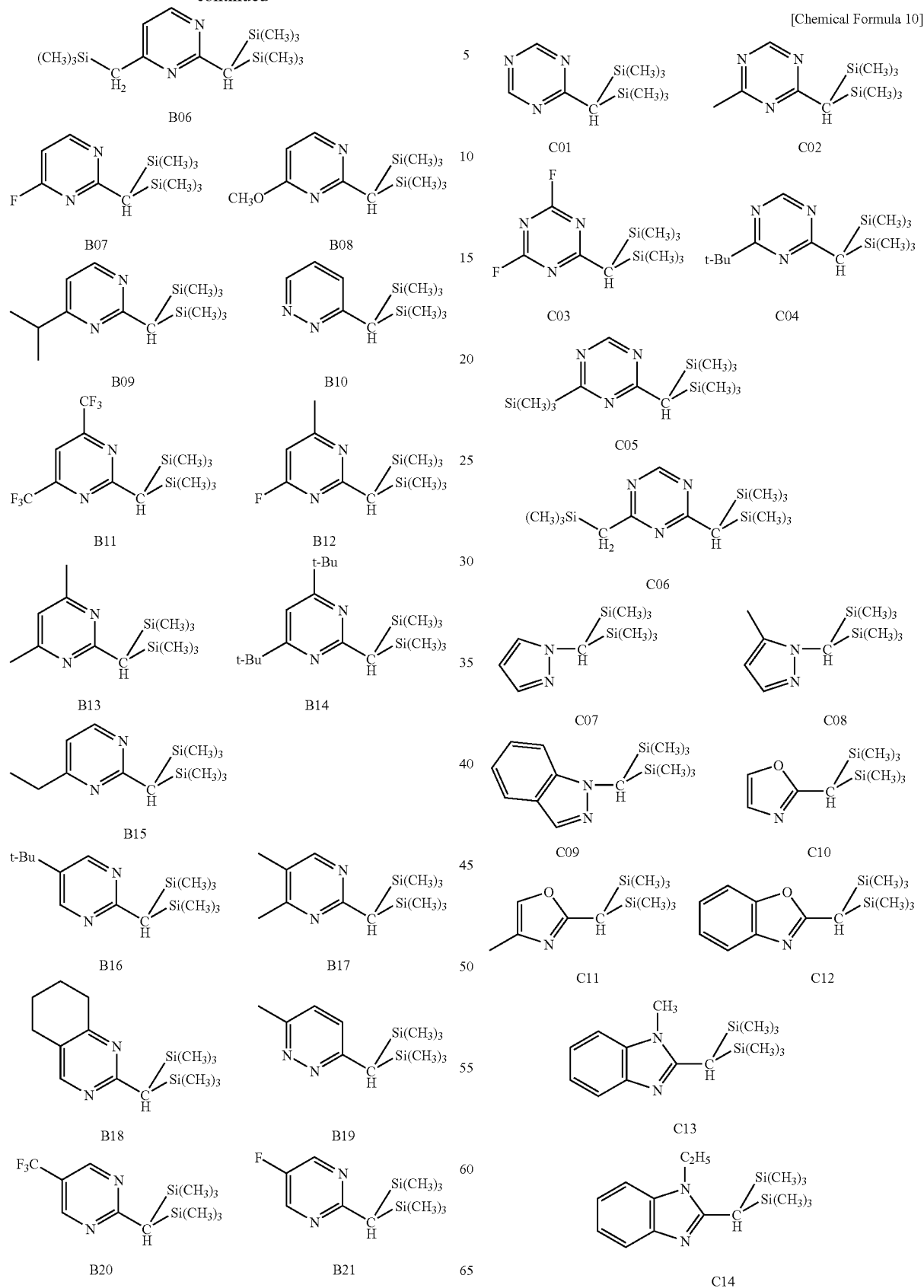

-continued
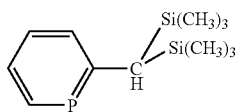
C15
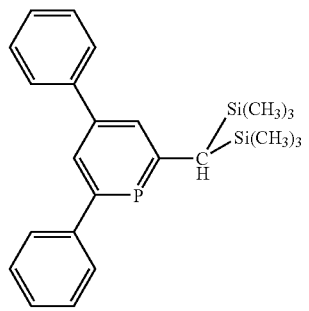
C16
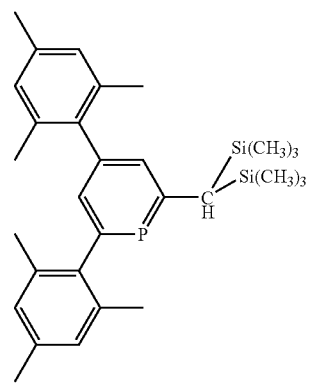
C17
[Chemical Formula 11]
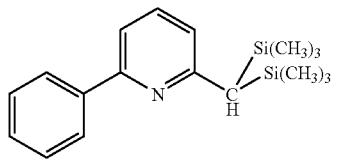
D01
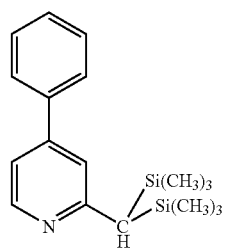
D02
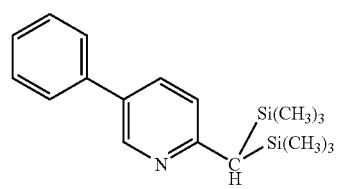
D03
-continued
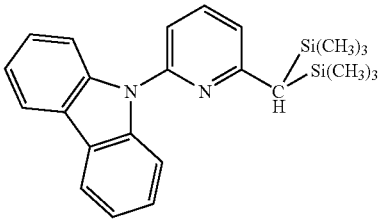
D04
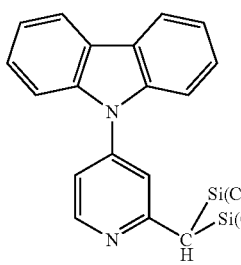
D05
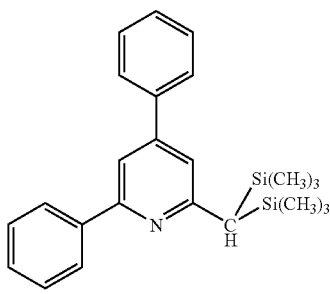
D06
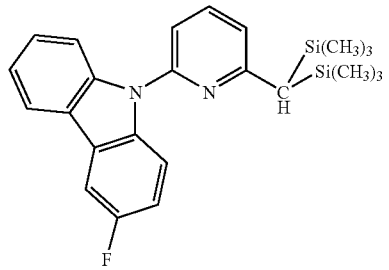
D07
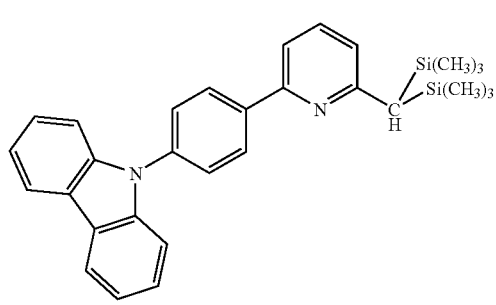
D08

-continued
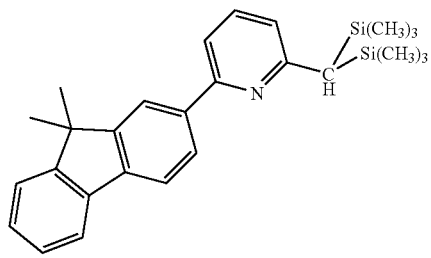
D09
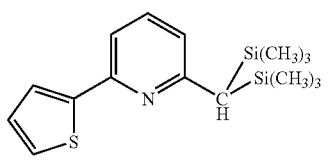
D10
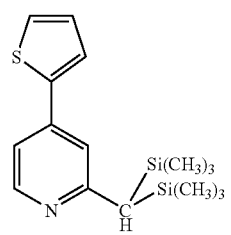
D11
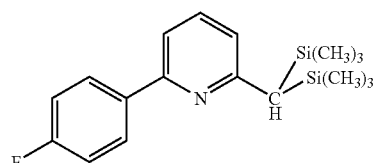
D12
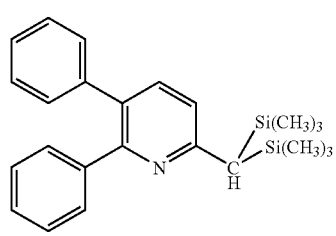
D13
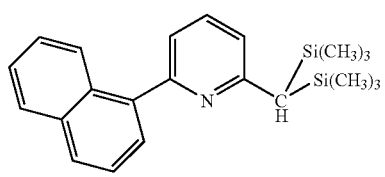
D14
-continued
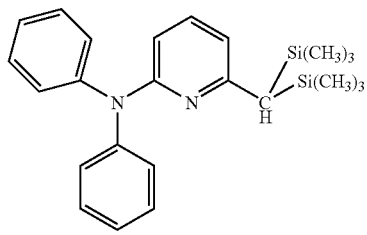
D15
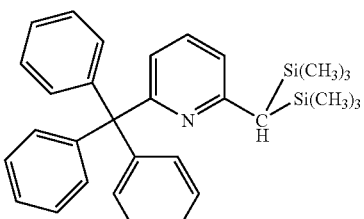
D16
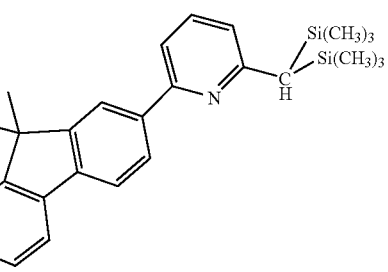
D17
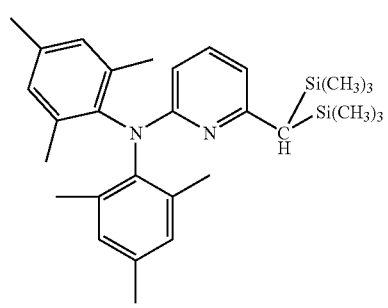
D18
[Chemical Formula 12]
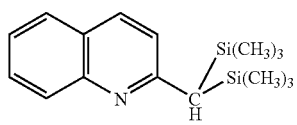
E01

-continued

E02, E03, E13, E04, E14, E05, E03, E06, E15, E07, E08, E16, E09, F01, F02, E11, E12, F03, F04

[Chemical Formula 13]

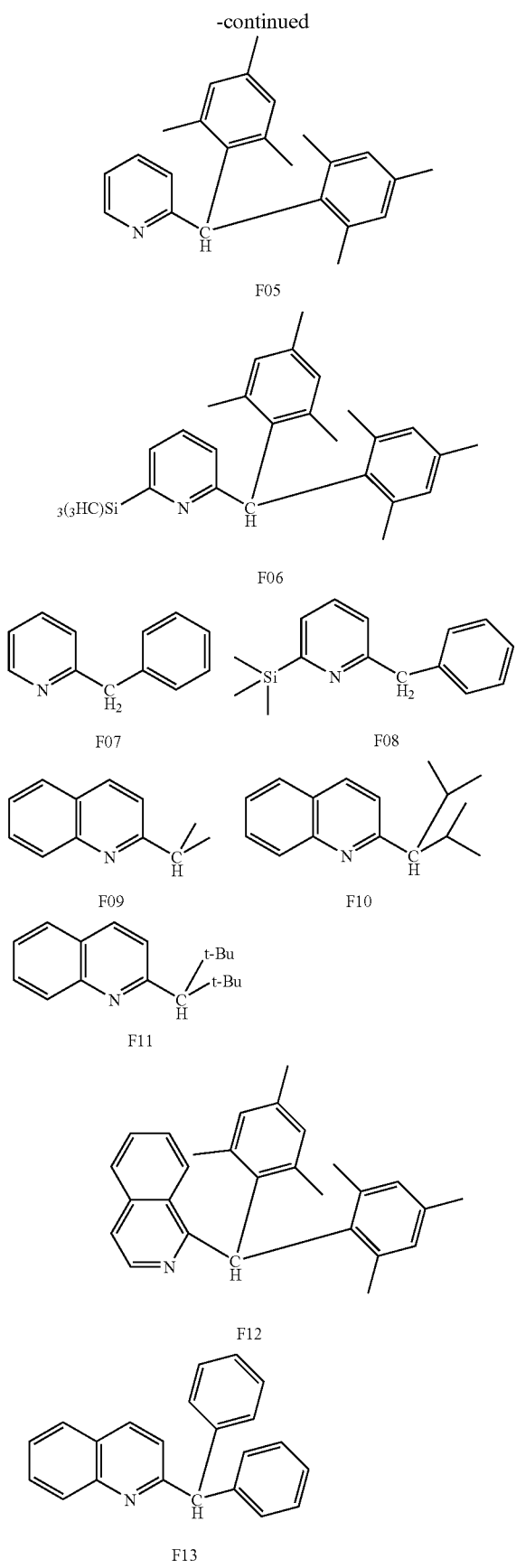
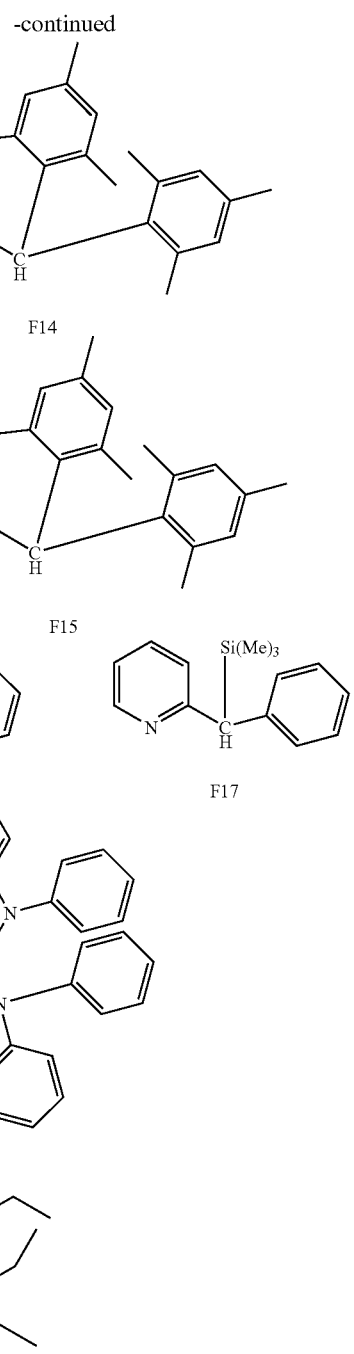
[Chemical Formula 14]

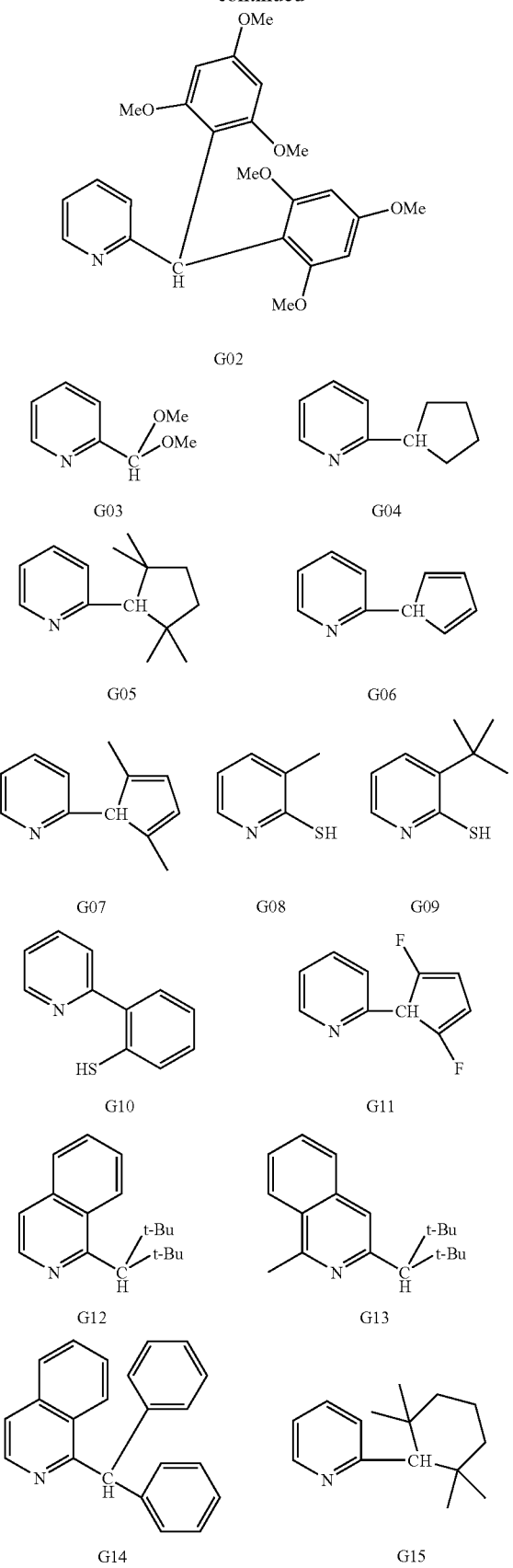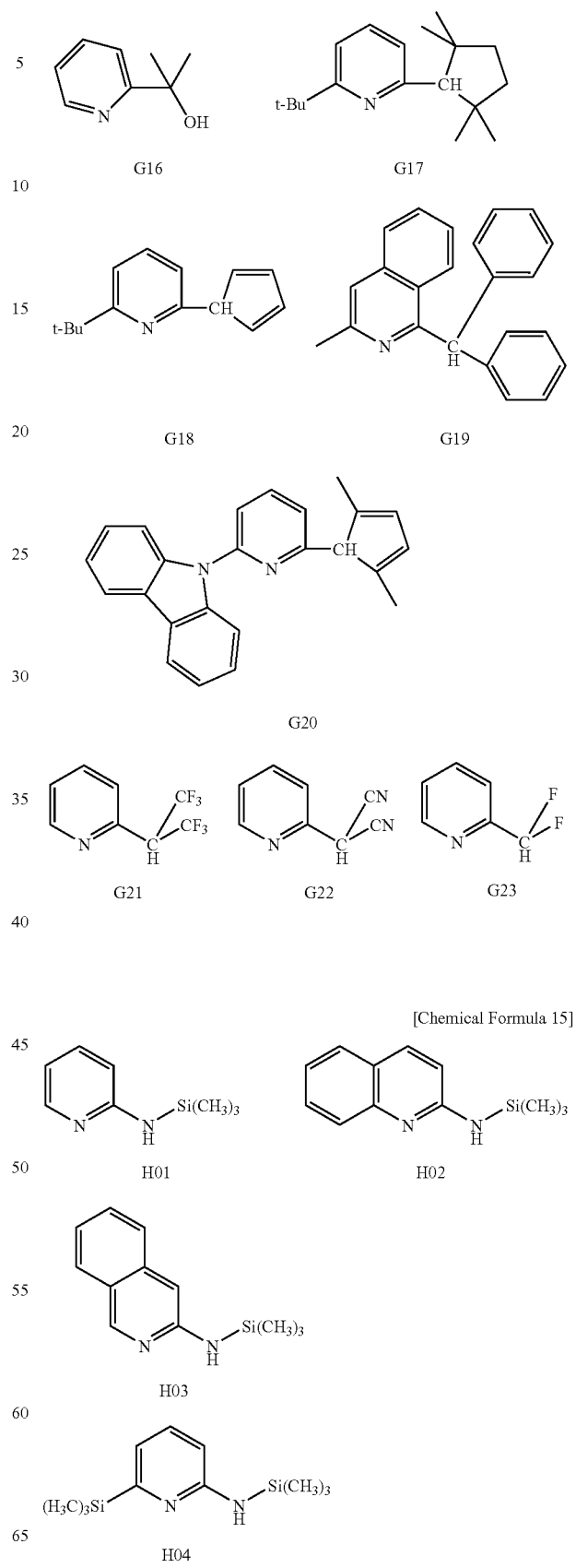

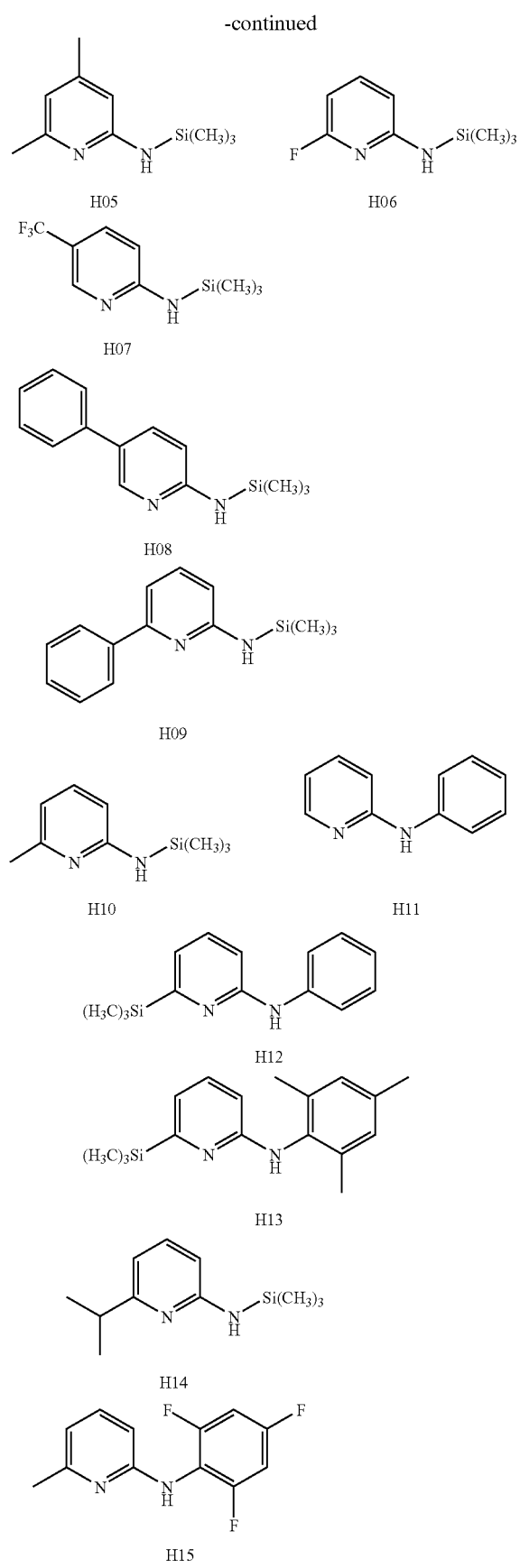
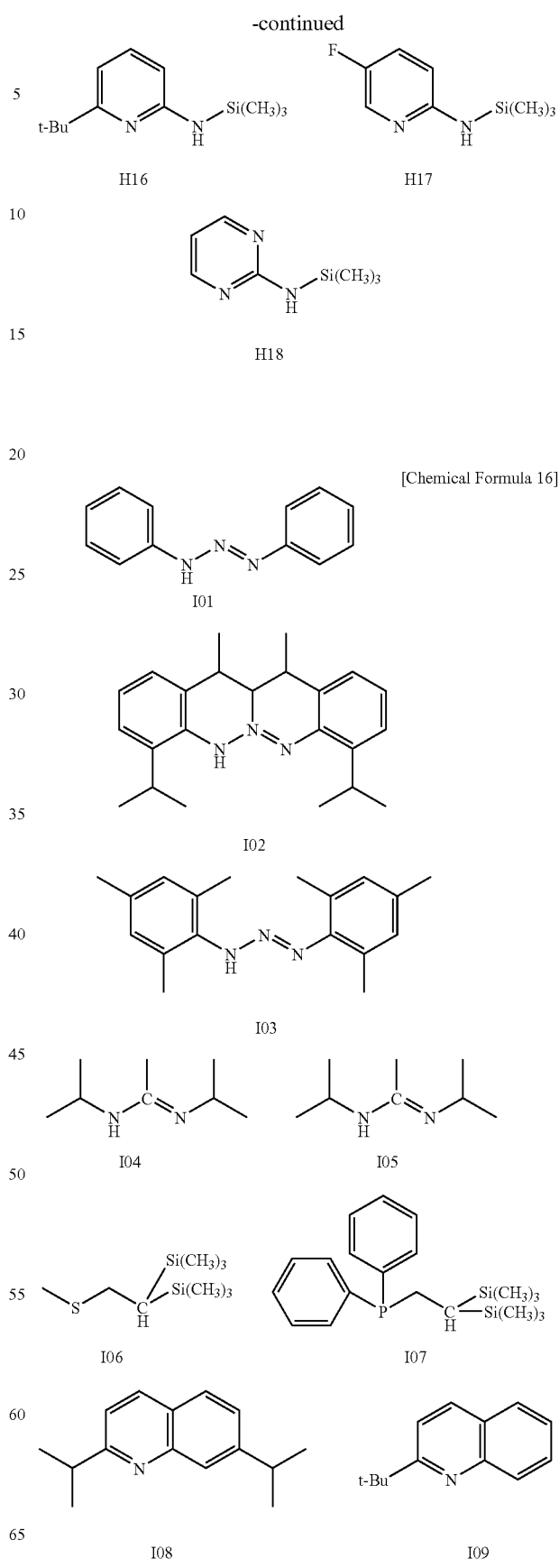

-continued
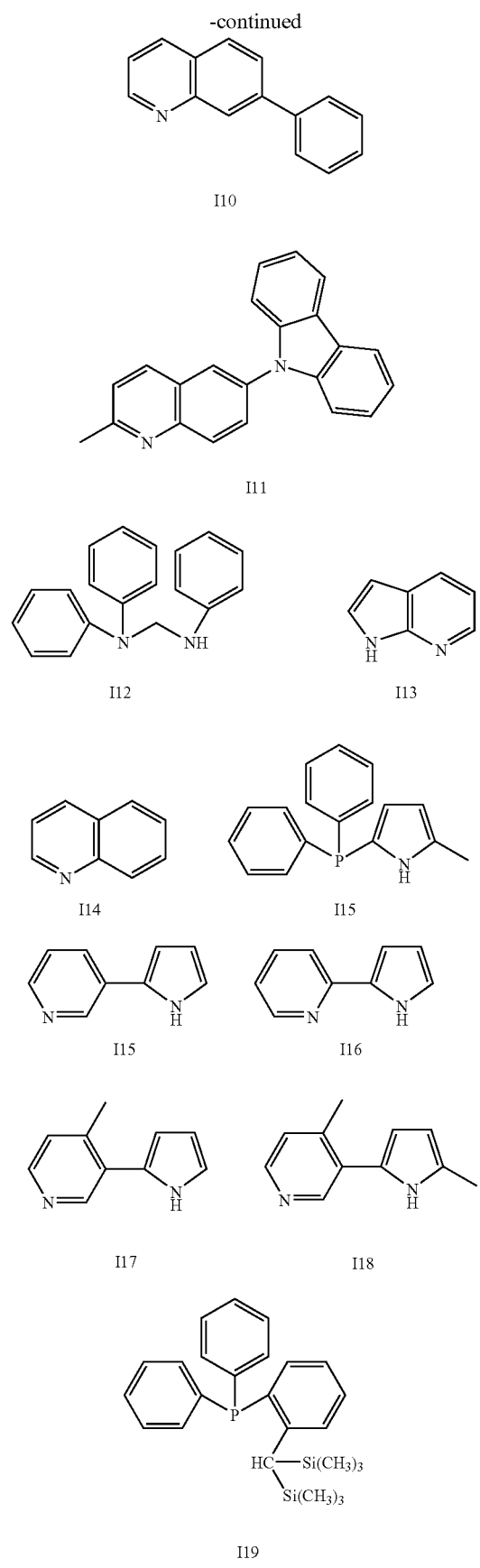
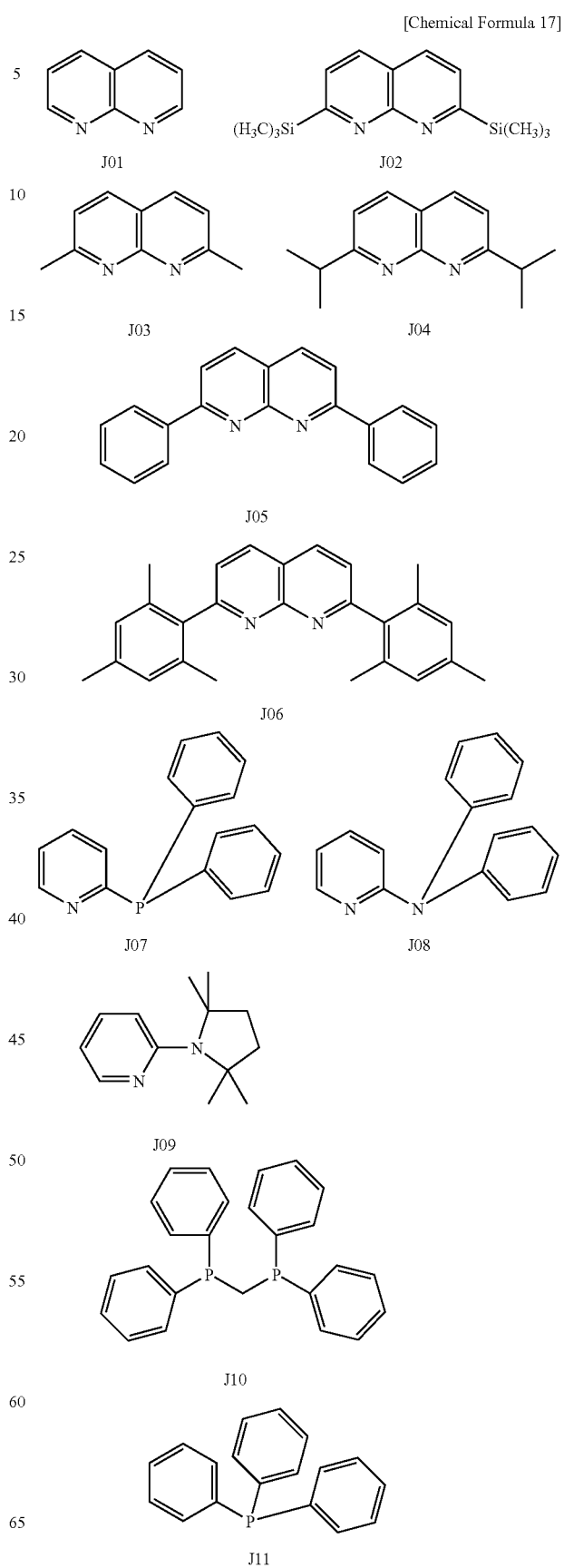

Ligands shown in chemical formulae 6 to 15 may become a bidentate ligand with negative monovalence after a hydrogen atom is withdrawn from "CH" or "NH" in the formulae, so that the hydrogen atom-withdrawn nitrogen atom or carbon atom become a coordinating atom to a copper atom. Further, since ligands shown in chemical formula 16 are zerovalent, a coordination compound as a whole is positive divalent. In the case of these ionic coordination compounds, $PF_6^-$, $ClO_4^-$, $BF_4^-$ and a halogen ion can be used as a counter anion. For example, quadridentate ligands in which two of bidentate ligands shown in chemical formulae 6 to 16 are coupled by a covalent bond can be used as a ligand of the present invention.

Next, specific examples of the copper coordination compound of the present invention are shown in Tables 1 to 7 and Chemical Formula 17. Reference characters in the columns of "A and B", "A" and "B" of the Tables represent the above-described ligands. Tables 1 and 2 show coordination compounds in which ligands A and B have the same structure. Tables 3 to 7 show coordination compounds in which ligands A and B have different structures. Chemical Formula 17 shows trinuclear coordination compounds.

TABLE 1

| Compound Number | A and B |
|---|---|
| 1001 | A01 |
| 1002 | A02 |
| 1003 | A03 |
| 1004 | A04 |
| 1005 | A05 |
| 1006 | A06 |
| 1007 | A07 |
| 1008 | A08 |
| 1009 | A09 |
| 1010 | A10 |
| 1011 | A11 |
| 1012 | A12 |
| 1013 | A13 |
| 1014 | A14 |
| 1015 | A15 |
| 1016 | A16 |
| 1017 | A17 |
| 1018 | A18 |
| 1019 | A19 |
| 1020 | A20 |
| 1021 | A21 |
| 1022 | B01 |
| 1023 | B02 |
| 1024 | B03 |
| 1025 | B04 |
| 1026 | B05 |
| 1027 | B06 |
| 1028 | B07 |
| 1029 | B08 |
| 1030 | B09 |
| 1031 | B10 |
| 1032 | B11 |
| 1033 | B12 |
| 1034 | B13 |
| 1035 | B14 |
| 1036 | B15 |
| 1037 | B16 |
| 1038 | B17 |
| 1039 | B18 |
| 1040 | B19 |
| 1041 | B20 |
| 1042 | B21 |
| 1043 | C01 |
| 1044 | C02 |
| 1045 | C03 |
| 1046 | C04 |
| 1047 | C05 |
| 1048 | C06 |
| 1049 | C07 |

TABLE 1-continued

| Compound Number | A and B |
|---|---|
| 1050 | C08 |
| 1051 | C09 |
| 1052 | C10 |
| 1053 | C11 |
| 1054 | C12 |
| 1055 | C13 |
| 1056 | C14 |
| 1057 | C15 |
| 1058 | C16 |
| 1059 | C17 |
| 1060 | D01 |
| 1061 | D02 |
| 1062 | D03 |
| 1063 | D04 |
| 1064 | D05 |
| 1065 | D06 |
| 1066 | D07 |
| 1067 | D08 |
| 1068 | D09 |
| 1069 | D10 |
| 1070 | D11 |
| 1071 | D12 |
| 1072 | D13 |
| 1073 | D14 |
| 1074 | D15 |
| 1075 | D16 |
| 1076 | D17 |
| 1077 | D18 |
| 1078 | E01 |
| 1079 | E02 |
| 1080 | E03 |
| 1081 | E04 |
| 1082 | E05 |
| 1083 | E06 |
| 1084 | E07 |
| 1085 | E08 |
| 1086 | E09 |
| 1087 | E10 |
| 1088 | E11 |
| 1089 | E12 |
| 1090 | E13 |
| 1091 | E14 |
| 1092 | E15 |
| 1093 | E16 |
| 1094 | F01 |
| 1095 | F02 |
| 1096 | F03 |
| 1097 | F04 |
| 1098 | F05 |
| 1099 | F06 |
| 1100 | F07 |
| 1101 | F08 |
| 1102 | F09 |
| 1103 | F10 |
| 1104 | F11 |
| 1105 | F12 |
| 1106 | F13 |
| 1107 | F14 |
| 1108 | F15 |
| 1109 | F16 |
| 1110 | F17 |
| 1111 | G01 |
| 1112 | G02 |
| 1113 | G03 |
| 1114 | G04 |
| 1115 | G05 |
| 1116 | G06 |
| 1117 | G07 |
| 1118 | G08 |
| 1119 | G09 |
| 1120 | G10 |
| 1121 | G11 |
| 1122 | G12 |
| 1123 | G13 |
| 1124 | G14 |
| 1125 | G15 |
| 1126 | G16 |

TABLE 1-continued

| Compound Number | A and B |
|---|---|
| 1127 | G17 |
| 1128 | G18 |
| 1129 | G19 |
| 1130 | G20 |
| 1131 | G21 |
| 1132 | G22 |
| 1133 | G23 |
| 1134 | H01 |
| 1135 | H02 |
| 1136 | H03 |
| 1137 | H04 |
| 1138 | H05 |
| 1139 | H06 |
| 1140 | H07 |
| 1141 | H08 |
| 1142 | H09 |
| 1143 | H10 |
| 1144 | H11 |
| 1145 | H12 |
| 1146 | H13 |
| 1147 | H14 |
| 1148 | H15 |
| 1149 | H16 |
| 1150 | H17 |

TABLE 2

| Compound Number | A and B |
|---|---|
| 1151 | I1 |
| 1152 | I2 |
| 1153 | I3 |
| 1154 | I4 |
| 1155 | I5 |
| 1156 | I6 |
| 1157 | I7 |
| 1158 | I8 |
| 1159 | I9 |
| 1160 | I10 |
| 1161 | I11 |
| 1162 | I12 |
| 1163 | I13 |
| 1164 | I14 |
| 1165 | I15 |
| 1166 | I16 |
| 1167 | I17 |
| 1168 | I18 |
| 1169 | I19 |
| 1170 | J01 |
| 1171 | J02 |
| 1172 | J03 |
| 1173 | J04 |
| 1174 | J05 |
| 1175 | J06 |
| 1176 | J07 |
| 1177 | J08 |
| 1178 | J09 |
| 1179 | J10 |
| 1180 | F18 |
| 1181 | F19 |

TABLE 3

| Compound Number | A | B |
|---|---|---|
| 2001 | A01 | A02 |
| 2002 | A01 | A04 |
| 2003 | A01 | A05 |
| 2004 | A01 | A06 |
| 2005 | A01 | A07 |
| 2006 | A01 | A09 |
| 2007 | A01 | A11 |

TABLE 3-continued

| Compound Number | A | B |
|---|---|---|
| 2008 | A01 | A12 |
| 2009 | A01 | A13 |
| 2010 | A01 | A14 |
| 2011 | A01 | A15 |
| 2012 | A01 | A21 |
| 2013 | A01 | B01 |
| 2014 | A01 | B02 |
| 2015 | A01 | B06 |
| 2016 | A01 | B11 |
| 2017 | A01 | B12 |
| 2018 | A01 | B20 |
| 2019 | A01 | C01 |
| 2020 | A01 | C02 |
| 2021 | A01 | C04 |
| 2022 | A01 | C05 |
| 2023 | A01 | C06 |
| 2024 | A01 | C07 |
| 2025 | A01 | C10 |
| 2026 | A01 | C11 |
| 2027 | A01 | C12 |
| 2028 | A01 | C13 |
| 2029 | A01 | C14 |
| 2030 | A01 | C16 |
| 2031 | A01 | C07 |
| 2032 | A01 | D01 |
| 2033 | A01 | D04 |
| 2034 | A01 | D06 |
| 2035 | A01 | D07 |
| 2036 | A01 | D08 |
| 2037 | A01 | D09 |
| 2038 | A01 | D15 |
| 2039 | A01 | D16 |
| 2040 | A01 | D17 |
| 2041 | A01 | D18 |
| 2042 | A01 | E03 |
| 2043 | A01 | E08 |
| 2044 | A01 | E11 |
| 2045 | A01 | E12 |
| 2046 | A01 | E13 |
| 2047 | A01 | E14 |
| 2048 | A01 | E15 |
| 2049 | A01 | E16 |
| 2050 | A01 | F01 |
| 2051 | A01 | F03 |
| 2052 | A01 | F04 |
| 2053 | A01 | F05 |
| 2054 | A01 | F11 |
| 2055 | A01 | F14 |
| 2056 | A01 | F17 |
| 2057 | A01 | G01 |
| 2058 | A01 | G02 |
| 2059 | A01 | G03 |
| 2060 | A01 | G06 |
| 2061 | A01 | G12 |
| 2062 | A01 | G13 |
| 2063 | A01 | G15 |
| 2064 | A01 | G20 |
| 2065 | A01 | G21 |
| 2066 | A01 | G23 |
| 2067 | A01 | H01 |
| 2068 | A01 | H04 |
| 2069 | A01 | H10 |
| 2070 | A01 | H12 |
| 2071 | A01 | H14 |
| 2072 | A01 | H17 |
| 2073 | A01 | I01 |
| 2074 | A01 | I03 |
| 2075 | A01 | I14 |
| 2076 | A01 | I15 |
| 2077 | A01 | J01 |
| 2078 | A01 | J07 |
| 2079 | A01 | J10 |
| 2080 | A02 | A04 |
| 2081 | A02 | A05 |
| 2082 | A02 | A06 |
| 2083 | A02 | A07 |
| 2084 | A02 | A09 |

TABLE 3-continued

| Compound Number | A | B |
|---|---|---|
| 2085 | A02 | A11 |
| 2086 | A02 | A12 |
| 2087 | A02 | A13 |
| 2088 | A02 | A14 |
| 2089 | A02 | A15 |
| 2090 | A02 | A21 |
| 2091 | A02 | B01 |
| 2092 | A02 | B02 |
| 2093 | A02 | B10 |
| 2094 | A02 | B11 |
| 2095 | A02 | B12 |
| 2096 | A02 | B20 |
| 2097 | A02 | C01 |
| 2098 | A02 | C02 |
| 2099 | A02 | C04 |
| 2100 | A02 | C05 |
| 2101 | A02 | C06 |
| 2102 | A02 | C07 |
| 2103 | A02 | C10 |
| 2104 | A02 | C11 |
| 2105 | A02 | C12 |
| 2106 | A02 | C13 |
| 2107 | A02 | C14 |
| 2108 | A02 | C16 |
| 2109 | A02 | C07 |
| 2110 | A02 | D01 |
| 2111 | A02 | D04 |
| 2112 | A02 | D06 |
| 2113 | A02 | D07 |
| 2114 | A02 | D08 |
| 2115 | A02 | D09 |
| 2116 | A02 | D15 |
| 2117 | A02 | D16 |
| 2118 | A02 | D17 |
| 2119 | A02 | D18 |
| 2120 | A02 | E03 |
| 2121 | A02 | E08 |
| 2122 | A02 | E11 |
| 2123 | A02 | E12 |
| 2124 | A02 | E13 |
| 2125 | A02 | E14 |
| 2126 | A02 | E15 |
| 2127 | A02 | E16 |
| 2128 | A02 | F01 |
| 2129 | A02 | F03 |
| 2130 | A02 | F04 |
| 2131 | A02 | F05 |
| 2132 | A02 | F11 |
| 2133 | A02 | F14 |
| 2134 | A02 | F17 |
| 2135 | A02 | G01 |
| 2136 | A02 | G02 |
| 2137 | A02 | G03 |
| 2138 | A02 | G06 |
| 2139 | A02 | G12 |
| 2140 | A02 | G13 |
| 2141 | A02 | G15 |
| 2142 | A02 | G20 |
| 2143 | A02 | G21 |
| 2144 | A02 | G23 |
| 2145 | A02 | H01 |
| 2146 | A02 | H04 |
| 2147 | A02 | H10 |
| 2148 | A02 | H12 |
| 2149 | A02 | H14 |
| 2150 | A02 | H17 |

TABLE 4

| Compound Number | A | B |
|---|---|---|
| 2151 | A02 | I01 |
| 2152 | A02 | I03 |
| 2153 | A02 | I14 |

TABLE 4-continued

| Compound Number | A | B |
|---|---|---|
| 2154 | A02 | I15 |
| 2155 | A02 | J01 |
| 2156 | A02 | J07 |
| 2157 | A02 | J10 |
| 2158 | A03 | A09 |
| 2159 | A03 | A13 |
| 2160 | A03 | A18 |
| 2161 | A03 | A20 |
| 2162 | A03 | B01 |
| 2163 | A03 | B02 |
| 2164 | A03 | B10 |
| 2165 | A03 | B13 |
| 2166 | A03 | B19 |
| 2167 | A03 | C01 |
| 2168 | A03 | C06 |
| 2169 | A03 | C10 |
| 2170 | A03 | C14 |
| 2171 | A03 | C16 |
| 2172 | A03 | D04 |
| 2173 | A03 | D08 |
| 2174 | A03 | D09 |
| 2175 | A03 | D15 |
| 2176 | A03 | D16 |
| 2177 | A03 | D18 |
| 2178 | A03 | E02 |
| 2179 | A03 | E12 |
| 2180 | A03 | F03 |
| 2181 | A03 | F04 |
| 2182 | A03 | F14 |
| 2183 | A03 | F17 |
| 2184 | A03 | G01 |
| 2185 | A03 | G18 |
| 2186 | A03 | H01 |
| 2187 | A03 | H10 |
| 2188 | A03 | H14 |
| 2189 | A03 | I1 |
| 2190 | A03 | I15 |
| 2191 | A03 | J07 |
| 2192 | A04 | A05 |
| 2193 | A04 | A06 |
| 2194 | A04 | A07 |
| 2195 | A04 | A09 |
| 2196 | A04 | A11 |
| 2197 | A04 | A12 |
| 2198 | A04 | A13 |
| 2199 | A04 | A14 |
| 2200 | A04 | A15 |
| 2201 | A04 | A21 |
| 2202 | A04 | B01 |
| 2203 | A04 | B02 |
| 2204 | A04 | B10 |
| 2205 | A04 | B11 |
| 2206 | A04 | B12 |
| 2207 | A04 | B20 |
| 2208 | A04 | C01 |
| 2209 | A04 | C02 |
| 2210 | A04 | C04 |
| 2211 | A04 | C05 |
| 2212 | A04 | C06 |
| 2213 | A04 | C07 |
| 2214 | A04 | C10 |
| 2215 | A04 | C11 |
| 2216 | A04 | C12 |
| 2217 | A04 | C13 |
| 2218 | A04 | C14 |
| 2219 | A04 | C16 |
| 2220 | A04 | C07 |
| 2221 | A04 | D01 |
| 2222 | A04 | D04 |
| 2223 | A04 | D06 |
| 2224 | A04 | D07 |
| 2225 | A04 | D08 |
| 2226 | A04 | D09 |
| 2227 | A04 | D15 |
| 2228 | A04 | D16 |
| 2229 | A04 | D17 |
| 2230 | A04 | D18 |

TABLE 4-continued

| Compound Number | A | B |
| --- | --- | --- |
| 2231 | A04 | E03 |
| 2232 | A04 | E08 |
| 2233 | A04 | E11 |
| 2234 | A04 | E12 |
| 2235 | A04 | E13 |
| 2236 | A04 | E14 |
| 2237 | A04 | E15 |
| 2238 | A04 | E16 |
| 2239 | A04 | F01 |
| 2240 | A04 | F03 |
| 2241 | A04 | F04 |
| 2242 | A04 | F05 |
| 2243 | A04 | F11 |
| 2244 | A04 | F14 |
| 2245 | A04 | F17 |
| 2246 | A04 | G01 |
| 2247 | A04 | G02 |
| 2248 | A04 | G03 |
| 2249 | A04 | G06 |
| 2250 | A04 | G12 |
| 2251 | A04 | G13 |
| 2252 | A04 | G15 |
| 2253 | A04 | G20 |
| 2254 | A04 | G21 |
| 2255 | A04 | G23 |
| 2256 | A04 | H01 |
| 2257 | A04 | H04 |
| 2258 | A04 | H10 |
| 2259 | A04 | H12 |
| 2260 | A04 | H14 |
| 2261 | A04 | H17 |
| 2262 | A04 | I01 |
| 2263 | A04 | I03 |
| 2264 | A04 | I14 |
| 2265 | A04 | I15 |
| 2266 | A04 | J01 |
| 2267 | A04 | J07 |
| 2268 | A04 | J10 |
| 2269 | A05 | A09 |
| 2270 | A05 | A13 |
| 2271 | A05 | A18 |
| 2272 | A05 | A20 |
| 2273 | A05 | B01 |
| 2274 | A05 | B02 |
| 2275 | A05 | B10 |
| 2276 | A05 | B13 |
| 2277 | A05 | B19 |
| 2278 | A05 | C01 |
| 2279 | A05 | C06 |
| 2280 | A05 | C10 |
| 2281 | A05 | C14 |
| 2282 | A05 | C16 |
| 2283 | A05 | D04 |
| 2284 | A05 | D08 |
| 2285 | A05 | D09 |
| 2286 | A05 | D15 |
| 2287 | A05 | D16 |
| 2288 | A05 | D18 |
| 2289 | A05 | E02 |
| 2290 | A05 | E12 |
| 2291 | A05 | F03 |
| 2292 | A05 | F04 |
| 2293 | A05 | F14 |
| 2294 | A05 | F17 |
| 2295 | A05 | G01 |
| 2296 | A05 | G18 |
| 2297 | A05 | H01 |
| 2298 | A05 | H10 |
| 2299 | A05 | H14 |
| 2300 | A05 | I1 |

TABLE 5

| Compound Number | A | B |
| --- | --- | --- |
| 2301 | A05 | I15 |
| 2302 | A05 | J07 |
| 2303 | A06 | A09 |
| 2304 | A06 | A13 |
| 2305 | A06 | A18 |
| 2306 | A06 | A20 |
| 2307 | A06 | B01 |
| 2308 | A06 | B02 |
| 2309 | A06 | B10 |
| 2310 | A06 | B13 |
| 2311 | A06 | B19 |
| 2312 | A06 | C01 |
| 2313 | A06 | C06 |
| 2314 | A06 | C10 |
| 2315 | A06 | C14 |
| 2316 | A06 | C16 |
| 2317 | A06 | D04 |
| 2318 | A06 | D08 |
| 2319 | A06 | D09 |
| 2320 | A06 | D15 |
| 2321 | A06 | D16 |
| 2322 | A06 | D18 |
| 2323 | A06 | E02 |
| 2324 | A06 | E12 |
| 2325 | A06 | F03 |
| 2326 | A06 | F04 |
| 2327 | A06 | F14 |
| 2328 | A06 | F17 |
| 2329 | A06 | G01 |
| 2330 | A06 | G18 |
| 2331 | A06 | H01 |
| 2332 | A06 | H10 |
| 2333 | A06 | H14 |
| 2334 | A06 | I1 |
| 2335 | A06 | I15 |
| 2336 | A06 | J07 |
| 2337 | A07 | A09 |
| 2338 | A07 | A12 |
| 2339 | A07 | B01 |
| 2340 | A07 | B05 |
| 2341 | A07 | B20 |
| 2342 | A07 | C14 |
| 2343 | A07 | C16 |
| 2344 | A07 | D04 |
| 2345 | A07 | D09 |
| 2346 | A07 | D15 |
| 2347 | A07 | E01 |
| 2348 | A07 | F04 |
| 2349 | A07 | G21 |
| 2350 | A07 | I15 |
| 2351 | A08 | A09 |
| 2352 | A08 | A12 |
| 2353 | A08 | B01 |
| 2354 | A08 | B05 |
| 2355 | A08 | B20 |
| 2356 | A08 | C14 |
| 2357 | A08 | C16 |
| 2358 | A08 | D04 |
| 2359 | A08 | D09 |
| 2360 | A08 | D15 |
| 2361 | A08 | E03 |
| 2362 | A08 | F04 |
| 2363 | A08 | G21 |
| 2364 | A08 | I15 |
| 2365 | A09 | A11 |
| 2366 | A09 | A12 |
| 2367 | A09 | A13 |
| 2368 | A09 | A14 |
| 2369 | A09 | A15 |
| 2370 | A09 | A21 |
| 2371 | A09 | B01 |
| 2372 | A09 | B02 |
| 2373 | A09 | B10 |
| 2374 | A09 | B11 |
| 2375 | A09 | B12 |
| 2376 | A09 | B20 |
| 2377 | A09 | C01 |

TABLE 5-continued

| Compound Number | A | B |
|---|---|---|
| 2378 | A09 | C02 |
| 2379 | A09 | C04 |
| 2380 | A09 | C05 |
| 2381 | A09 | C06 |
| 2382 | A09 | C07 |
| 2383 | A09 | C10 |
| 2384 | A09 | C11 |
| 2385 | A09 | C12 |
| 2386 | A09 | C13 |
| 2387 | A09 | C14 |
| 2388 | A09 | C16 |
| 2389 | A09 | C07 |
| 2390 | A09 | D01 |
| 2391 | A09 | D04 |
| 2392 | A09 | D06 |
| 2393 | A09 | D07 |
| 2394 | A09 | D08 |
| 2395 | A09 | D09 |
| 2396 | A09 | D15 |
| 2397 | A09 | D16 |
| 2398 | A09 | D17 |
| 2399 | A09 | D18 |
| 2400 | A09 | E03 |
| 2401 | A09 | E08 |
| 2402 | A09 | E11 |
| 2403 | A09 | E12 |
| 2404 | A09 | E13 |
| 2405 | A09 | E14 |
| 2406 | A09 | E15 |
| 2407 | A09 | E16 |
| 2408 | A09 | F01 |
| 2409 | A09 | F03 |
| 2410 | A09 | F04 |
| 2411 | A09 | F05 |
| 2412 | A09 | F11 |
| 2413 | A09 | F14 |
| 2414 | A09 | F17 |
| 2415 | A09 | G01 |
| 2416 | A09 | G02 |
| 2417 | A09 | G03 |
| 2418 | A09 | G06 |
| 2419 | A09 | G12 |
| 2420 | A09 | G13 |
| 2421 | A09 | G15 |
| 2422 | A09 | G20 |
| 2423 | A09 | G21 |
| 2424 | A09 | G23 |
| 2425 | A09 | H01 |
| 2426 | A09 | H04 |
| 2427 | A09 | H10 |
| 2428 | A09 | H12 |
| 2429 | A09 | H14 |
| 2430 | A09 | H17 |
| 2431 | A09 | I01 |
| 2432 | A09 | I03 |
| 2433 | A09 | I14 |
| 2434 | A09 | I15 |
| 2435 | A09 | J01 |
| 2436 | A09 | J07 |
| 2437 | A09 | J10 |
| 2438 | A13 | B01 |
| 2439 | A13 | B05 |
| 2440 | A13 | B20 |
| 2441 | A13 | C14 |
| 2442 | A13 | C16 |
| 2443 | A13 | D04 |
| 2444 | A13 | D09 |
| 2445 | A13 | D15 |
| 2446 | A13 | E03 |
| 2447 | AI3 | F04 |
| 2448 | A13 | G21 |
| 2449 | A13 | I15 |
| 2450 | A13 | J07 |

TABLE 6

| Compound Number | A | B |
|---|---|---|
| 2451 | B01 | B05 |
| 2452 | B01 | B09 |
| 2453 | B01 | C14 |
| 2454 | B01 | C16 |
| 2455 | B01 | D04 |
| 2456 | B01 | D09 |
| 2457 | B01 | D15 |
| 2458 | B01 | E03 |
| 2459 | B01 | F04 |
| 2460 | B01 | G21 |
| 2461 | B01 | I15 |
| 2462 | B01 | J07 |
| 2463 | B06 | B09 |
| 2464 | B06 | C14 |
| 2465 | B06 | C16 |
| 2466 | B06 | D04 |
| 2467 | B06 | D09 |
| 2468 | B06 | D15 |
| 2469 | B06 | E03 |
| 2470 | B06 | F04 |
| 2471 | B06 | G21 |
| 2472 | B06 | I15 |
| 2473 | B06 | J07 |
| 2474 | B13 | C14 |
| 2475 | B13 | C16 |
| 2476 | B13 | D04 |
| 2477 | B13 | D09 |
| 2478 | B13 | D15 |
| 2479 | B13 | E03 |
| 2480 | B13 | F04 |
| 2481 | B13 | G21 |
| 2482 | B13 | I15 |
| 2483 | B13 | J07 |
| 2484 | C01 | C02 |
| 2485 | C01 | C04 |
| 2486 | C01 | C16 |
| 2487 | C01 | D04 |
| 2488 | C01 | D09 |
| 2489 | C01 | D15 |
| 2490 | C01 | E03 |
| 2491 | C01 | F04 |
| 2492 | C01 | G21 |
| 2493 | C07 | C09 |
| 2494 | C07 | C16 |
| 2495 | C07 | D04 |
| 2496 | C07 | D09 |
| 2497 | C07 | D15 |
| 2498 | C07 | E03 |
| 2499 | C07 | F04 |
| 2500 | C07 | G21 |
| 2501 | C14 | C16 |
| 2502 | C14 | D04 |
| 2503 | C14 | D06 |
| 2504 | C14 | D09 |
| 2505 | C14 | D16 |
| 2506 | C14 | E03 |
| 2507 | C14 | F04 |
| 2508 | C14 | G21 |
| 2509 | C16 | C17 |
| 2510 | C16 | D04 |
| 2511 | C16 | D06 |
| 2512 | C16 | D09 |
| 2513 | C16 | D16 |
| 2514 | C16 | E03 |
| 2515 | C16 | F04 |
| 2516 | C17 | D01 |
| 2517 | C17 | D04 |
| 2518 | C17 | D15 |
| 2519 | D04 | D07 |
| 2520 | D04 | D09 |
| 2521 | D04 | D15 |
| 2522 | D04 | D16 |
| 2523 | D04 | E03 |
| 2524 | D04 | E11 |
| 2525 | D04 | E12 |
| 2526 | D04 | F03 |
| 2527 | D04 | F05 |

TABLE 6-continued

| Compound Number | A | B |
|---|---|---|
| 2528 | D04 | F14 |
| 2529 | D04 | F17 |
| 2530 | D04 | G07 |
| 2531 | D04 | G11 |
| 2532 | D04 | G21 |
| 2533 | D04 | H05 |
| 2534 | D04 | H17 |
| 2535 | D04 | I14 |
| 2536 | D09 | D07 |
| 2537 | D09 | D09 |
| 2538 | D09 | D15 |
| 2539 | D09 | D16 |
| 2540 | D09 | E03 |
| 2541 | D09 | E11 |
| 2542 | D09 | E12 |
| 2543 | D09 | F03 |
| 2544 | D09 | F05 |
| 2545 | D09 | F14 |
| 2546 | D09 | F17 |
| 2547 | D09 | G07 |
| 2548 | D09 | G11 |
| 2549 | D09 | G21 |
| 2550 | D09 | H05 |
| 2551 | D09 | H17 |
| 2552 | D09 | I14 |
| 2553 | D16 | D16 |
| 2554 | D16 | E03 |
| 2555 | D16 | E11 |
| 2556 | D16 | E12 |
| 2557 | D16 | F03 |
| 2558 | D16 | F05 |
| 2559 | D16 | F14 |
| 2560 | D16 | F17 |
| 2561 | D16 | G07 |
| 2562 | D16 | G11 |
| 2563 | D16 | G21 |
| 2564 | D16 | H05 |
| 2565 | D16 | H17 |
| 2566 | D16 | I14 |
| 2567 | E01 | E03 |
| 2568 | E01 | A01 |
| 2569 | E01 | A02 |
| 2570 | E01 | A09 |
| 2571 | E01 | E11 |
| 2572 | E01 | E12 |
| 2573 | E01 | F03 |
| 2574 | E01 | F05 |
| 2575 | E01 | F14 |
| 2576 | E01 | F17 |
| 2577 | E01 | G07 |
| 2578 | E01 | G11 |
| 2579 | E01 | G21 |
| 2580 | E01 | H05 |
| 2581 | E01 | H17 |
| 2582 | E01 | I14 |
| 2583 | E02 | A01 |
| 2584 | E02 | A02 |
| 2585 | E02 | A09 |
| 2586 | E03 | E11 |
| 2587 | E03 | E12 |
| 2588 | E03 | F03 |
| 2589 | E03 | F05 |
| 2590 | E03 | F14 |
| 2591 | E03 | F17 |
| 2592 | E03 | G07 |
| 2593 | E03 | G11 |
| 2594 | E03 | G21 |
| 2595 | E03 | H05 |
| 2596 | E03 | H17 |
| 2597 | E03 | I14 |
| 2598 | E05 | A01 |
| 2599 | E05 | A02 |
| 2600 | E05 | A09 |

TABLE 7

| Compound Number | A | B |
|---|---|---|
| 2601 | E12 | F03 |
| 2602 | E12 | F05 |
| 2603 | E12 | F14 |
| 2604 | E12 | F17 |
| 2605 | E12 | G07 |
| 2606 | E12 | G11 |
| 2607 | E12 | G21 |
| 2608 | E12 | H05 |
| 2609 | E12 | H17 |
| 2610 | E12 | I14 |
| 2611 | E15 | E01 |
| 2612 | E15 | E02 |
| 2613 | E15 | E03 |
| 2614 | E15 | E08 |
| 2615 | E15 | F03 |
| 2616 | E15 | F05 |
| 2617 | E15 | F14 |
| 2618 | E15 | F17 |
| 2619 | F03 | F05 |
| 2620 | F03 | F14 |
| 2621 | F03 | F17 |
| 2622 | F03 | G07 |
| 2623 | F03 | G11 |
| 2624 | F03 | G21 |
| 2625 | F03 | H05 |
| 2626 | F03 | H17 |
| 2627 | F03 | I14 |
| 2628 | F04 | F05 |
| 2629 | F04 | F14 |
| 2630 | F04 | F17 |
| 2631 | F04 | G07 |
| 2632 | F04 | G11 |
| 2633 | F04 | G21 |
| 2634 | F04 | H05 |
| 2635 | F04 | H17 |
| 2636 | F04 | I14 |
| 2637 | F05 | A01 |
| 2638 | F05 | A02 |
| 2639 | F05 | A09 |
| 2640 | F05 | F14 |
| 2641 | F05 | F17 |
| 2642 | F05 | G07 |
| 2643 | F05 | G11 |
| 2644 | F05 | G21 |
| 2645 | F17 | G07 |
| 2646 | G21 | H12 |
| 2647 | I08 | I14 |
| 2648 | I10 | I14 |
| 2649 | I10 | I15 |
| 2650 | I14 | I15 |
| 2651 | J01 | J02 |
| 2652 | J01 | J03 |
| 2653 | J01 | J07 |
| 2654 | J02 | J07 |
| 2655 | J03 | J04 |
| 2656 | J07 | J08 |
| 2657 | J07 | J10 |

[Chemical Formula 18]
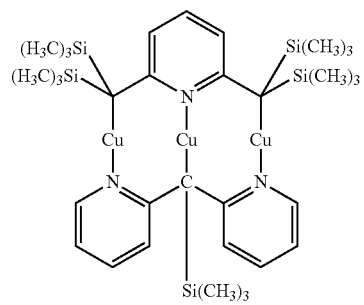
Exemplary compound 3001
Among the above examples, structural formulae of preferable copper coordination compounds are shown below.
[Chemical Formula 19]
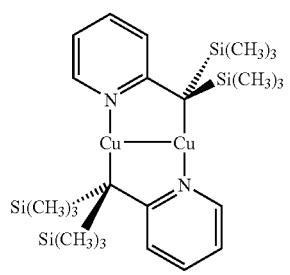
Exemplary compound 1001
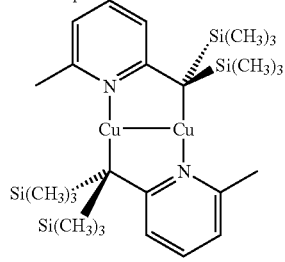
Exemplary compound 1002
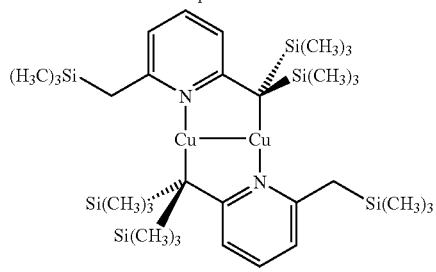
Exemplary compound 1006
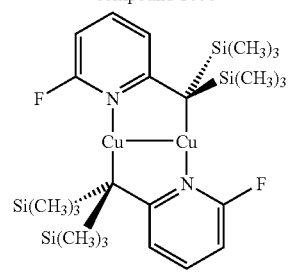
Exemplary compound 1007
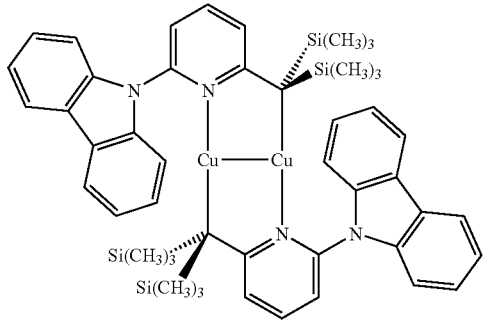
Exemplary compound 1063
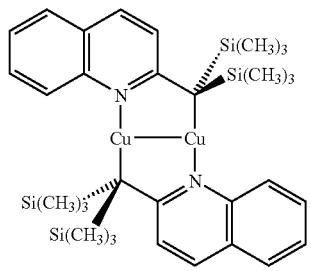
Exemplary compound 1078
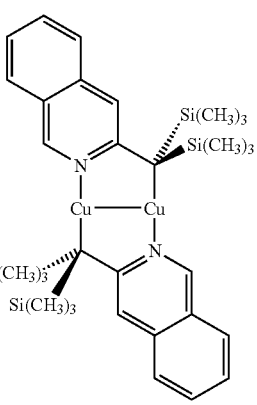
Exemplary cmpound 1079
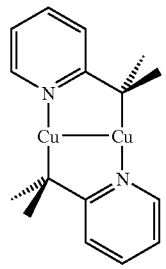
Exemplary compound 1094
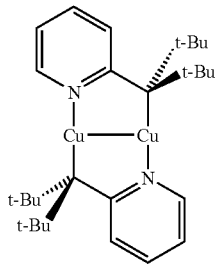
Exemplary compound 1096

-continued
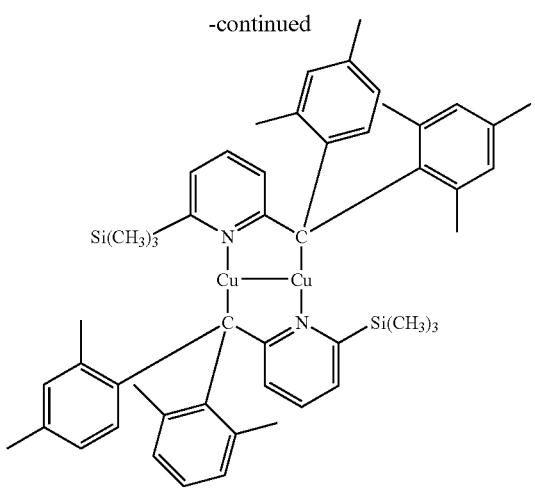
Exemplary compound 1099
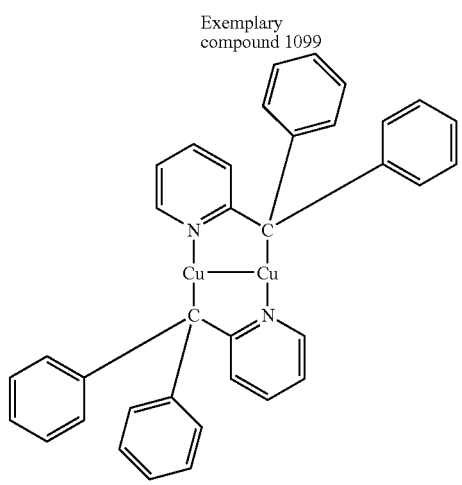
Exemplary compound 1097
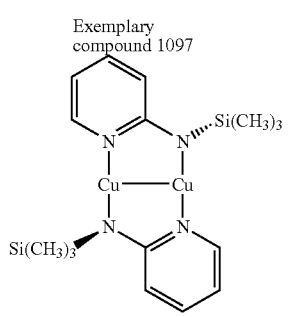
Exemplary compound 1134
[Chemical Formula 20]
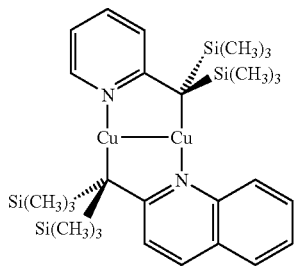
Exemplary compound 2568
-continued
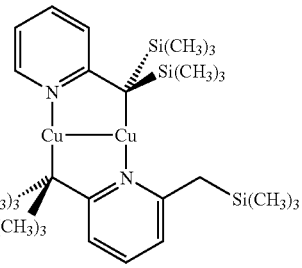
Exemplary compound 2004
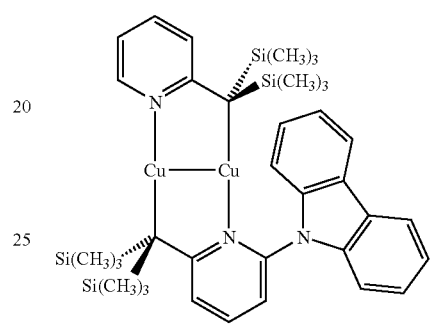
Exemplary compound 2033
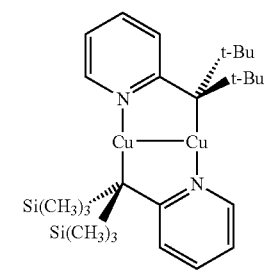
Exemplary compound 2051
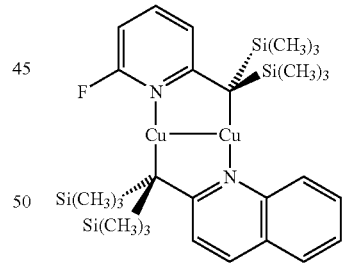
Exemplary compound 2347
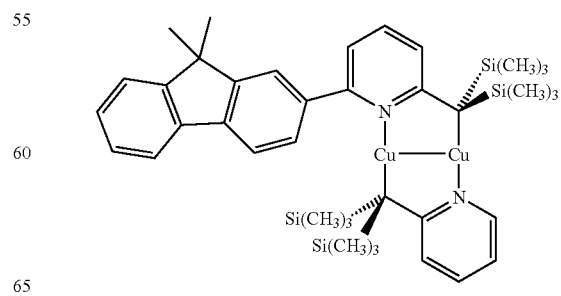
Exemplary compound 2037

[Chemical Formula 21]

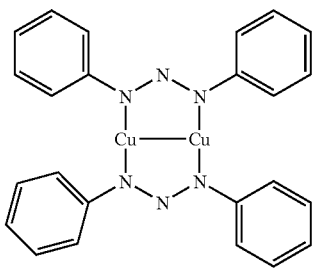

Exemplary compound 1151

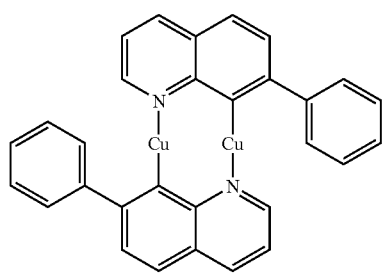

Exemplary compound 1160

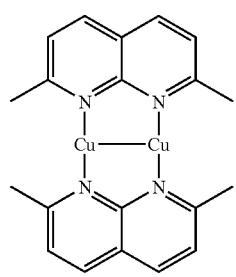

Exemplary compound 1172

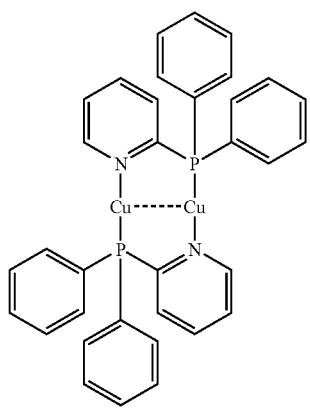

Exemplary compound 1176

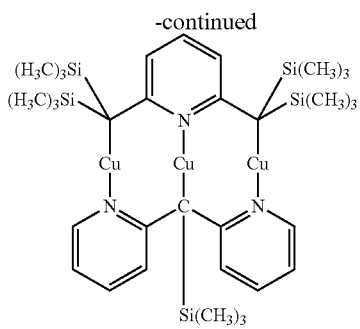

Exemplary compound 3001

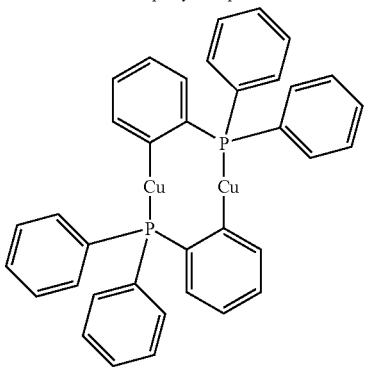

Exemplary compound 3002

Many of these cooper coordination compounds have a copper-copper interatomic distance of 3.2 Å or less, and interaction between copper atoms exists to maintain the bond therebetween. The copper coordination compound having a partial structure represented by the above general formula (1), preferably the above general formula (2) has two bidentate ligands such that the ligands surround two copper atoms from both ends of the two copper atoms. Taking Exemplary compound 1001 as an example, two ligands A01 are used as this ligand, and a nitrogen atom in pyridine and a carbon atom adjacent to the pyridine ring are coordinating atoms. These ligands are rotationally symmetrically coordinated in the coordination compound so as to surround two copper atoms. It is considered that an extremely bulky trimethylsilyl group in the ligand has an effect of stabilizing the bond between copper and ligand. Since the ligand has a three-dimensionally bulky substituent group therein, thermal stability is improved and it is desired as a luminescent material. Exemplary compound 1001 has a copper interatomic distance of 2.41 Å in its molecule and has a strong interaction. A compound having a copper interatomic distance of 3.2 or less Å has relatively strong interaction between copper atoms, thereby obtaining excellent thermal stability and luminescence characteristic.

A copper coordination compound using ligands having aromatic substituent group shown in Chemical Formula 10 can have not only a luminescence capability as a luminescent material but also a charge transport property due to its aromatic substituent. For example, when these coordination compounds are used in a luminescent layer at a high concentration, charge transport becomes possible, so that the use of the compound is more advantageous. Further, as the compound has several stable conformations, its amorphous property is enhanced to inhibit crystallization. This is more desirable for improving the durability of an organic LED device.

As another example, a structure having a trimethylsilyl group in one ligand but no trimethylsilyl group in the other ligand is possible like Exemplary compound 2051. This can destabilize a structural symmetry, decrease crystallizability, and improve an amorphous property. Furthermore, like Exemplary compound 2054, a difference in conjugation length can be provided to localize an excited state, in addition to the presence or absence of a trimethylsilyl group, thereby enhancing the stability of the device. The reason therefore is not clear, but it is possible to enhance the stability of the device by localizing an excited state of a luminescent material.

The luminescent material of the present invention exhibit good luminescence in a solid as mentioned above, and thus it can be used in a luminescent layer at a high concentration. However, when a coordination compound is constructed with the same ligands, such compound is relatively easily crystallized. When this compound is used as a luminescent device, problems may arise such as easy deterioration. Thus, crystallization can be inhibited by reducing the symmetry of its molecule. Examples of those compounds are shown in Tables 3 to 7. For example, Exemplary compound 2033 has a carbazole group in one ligand but no carbazole group in the other ligand. A compound having such molecular structure has high amorphousness and low crystallizability, and therefore it is more desired as a luminescent material for an organic LED device.

The extremely strong luminescence characteristics of the copper coordination compounds of the present invention were observed for the first time by the present inventors, and its application to a luminescent device is disclosed. Accordingly, its luminescence mechanism has not been revealed so far. The description at luminescence mentioned below provides one model for our luminescence mechanism.

As the lowest excited state in luminescence of the copper coordination compound of the present invention, the following 3 types are considered, or a mixed state of these 3 types are considered.

(1) MLCT (metal-to-ligand-charge-transfer) excited state
(2) metal-centered excited state
(3) ligand-centered ($\pi$-$\pi$*) excited state Since an excited state has a short life and is complicated, it is difficult to experimentally identify in detail an excited state for each coordination compound.

As mentioned above, many copper coordination compounds of the present invention has a short distance between copper atoms in its molecule and the distance is 3.2 Å or less. Twice the van der Waals' radius of copper atom is 2.8 Å, and it is considered that a new molecular orbital is formed due to interaction between copper atoms. The orbital formed by this interaction between copper atoms has a higher energy than an occupied orbital of a single copper atom, and thus it can be a HOMO orbital (the highest occupied molecular orbital).

Further, many of the coordination compounds of the present invention have an electron-deficiency heterocycle such as pyridine, pyrazine, pyrimidine, pyridazine, quinoline, isoquinoline, pyrazole, azaquinoline, and azaisoquinoline rings, directly coordinated with a copper atom through an N atom as shown by, for example, the above general formula (3). When the compound is in an excited state, an electron is transited to an upper orbital from the ground state but the above heterocycle easily accepts the electron due to electron-deficiency. Thus, there are many cases wherein the heterocycle accepts an electron from a copper atom at the time of excitation transition. A ligand having such heterocycle accepts an electron from a copper atom at the time of excitation transition. When an electron is charge-transferred from a metal to a ligand at the time of excitation transition, such excited state is referred to as MLCT excited state. The MLCT excited state of the Cu coordination compound of the present invention is considered as follows. That is, an orbital formed by interaction between two copper atoms becomes a HOMO orbital of the molecule, and charge transfer from the HOMO orbital to a ligand occurs. This is the MLCT exited state.

Also, when the coordination compound among those of the present invention has no heterocycle in its molecule or accepts no electron at the time of excitation transition, the excited state at the time of excitation transition becomes (2) metal-centered excited state. Also, it is considered that it becomes (3) ligand-centered ($\pi$-$\pi$*) excited state.

Luminescence is generally generated from the lowest excited state. Since various excited states are "mixed" in the lowest excited state, the luminescence characteristic is determined depending upon which excited state is main in the lowest excited state.

With respect to MLCT excited state, when luminescence energy is changed by changing ligands, these ligands are determined to be in main excited states. When the distance between copper atoms in the molecule is about 3.2 Å or less, a bonding orbital is formed due to metal interaction and thus such orbital is considered as MLCT transition. Molecular structural characteristics such as a distance between copper atoms can be determined by X-ray crystal structure analysis.

The luminescence wavelength of the copper coordination compound of the present invention can be controlled by changing a ligand. For example, the wavelength can be controlled by using an electron-withdrawing or electron-donating group on a pyridine ring, like a ligand shown in Chemical Formula 6. Further, the N atom number in a heterocycle or a ring structure of a heterocycle can be changed as shown in Chemical Formulae 8 and 9. Furthermore, the luminescence wavelength can be controlled by changing the conjugation length of an aromatic ring as shown in Chemical Formulae 10 and 11.

The copper coordination compound of the present invention has a luminescent lifetime of 0.1 to 100 µs in a solid state. The luminescence occurs through a triplet excited state, and composed of delayed fluorescence or phosphorescence. The photoluminescence yield is about 1 to 60%, and exhibits strong luminescence.

For high luminescence efficiency, it is important to allow a compound to have a ligand structure so that structure changes between the ground state and an excited state are inhibited. The copper coordination compound of the present invention inhibits the above structural changes more in a solid rather than in a solution, and thus strong luminescence can be obtained. This is one reason why the copper coordination compound exhibits good luminescence in a solid. Aluminum-quinolinol derivatives, coumarin derivatives, quinacridon derivatives, which have been used so far, allow for extremely strong luminescence in a solution, and that strong luminescence characteristic is maintained in a solid state as it is. This characteristic effectively works in the case of an organic EL device and high luminescence efficiency of the device can be obtained. However, the Cu coordination compound of the present invention exhibits stronger luminescence in a solid than in a solution. The present inventors have noticed this characteristic and found that this characteristic is useful for highly efficient and stable luminescence of an organic EL device.

The Cu coordination compound of the present invention is useful as a luminescent material of an organic EL device. The compound is suitable for vacuum-deposition process or spin coating process wherein the compound is applied in a solution, or application method using an ink jet nozzle, in addition to high luminescence efficiency of the compound. With no damage such as decomposition in a device fabrication process, stable device fabrication is possible.

Next, a luminescent device will be described. The luminescent device of the present invention preferably contains the above luminescent material in its luminescent layer.

FIGS. 1A to 1E show basic structures of organic EL devices of the present invention. Reference numerals in the figures are explained as follows. Reference numeral 11 denotes a metal electrode, 12 a luminescent layer, 13 a hole-transporting layer, 14 a transparent electrode, 15 a transparent substrate, 16 an electron-transporting layer, and 17 an exciton diffusion prevention layer.

As shown in FIGS. 1A to 1E, the organic EL device is generally composed of single or plural organic layers which are sandwiched by the transparent electrode 14 on the transparent substrate 15 and the metal electrode 11.

FIG. 1A shows a simplest structure of the device wherein an organic layer is composed of only a luminescent layer 12.

Figure 1B:
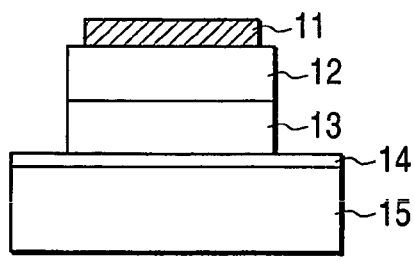
Figure 1C:
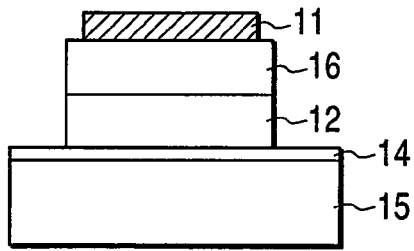

FIGS. 1B and 1C show the devices having two organic layers, which are a luminescent layer 12 and a hole-transporting layer 13; and a luminescent layer 12 and an electron-transporting layer 16, respectively.

Figure 1D:
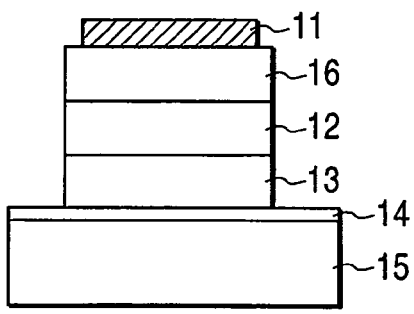

FIG. 1D show the device having three organic layers, which are a hole-transporting layer 13, a luminescent layer 12 and an electron-transporting layer 16.

Figure 1E:
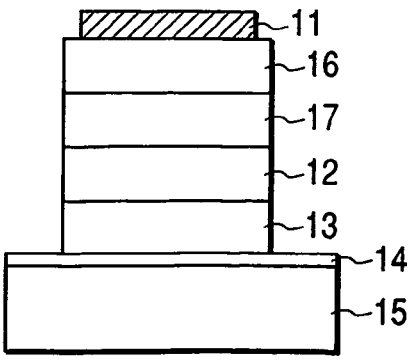

FIG. 1E show the device having four organic layers, which are a hole-transporting layer 13, a luminescent layer 12, an exciton diffusion prevention layer 17, and an electron-transporting layer 16.

For the luminescent layer 12, an aluminum-quinolinol complex or the like having electron transport property and luminescence characteristic (typical example is Alq as shown below) is used.

As the luminescent layer, it is possible to use a guest host type which contains a luminescent copper coordination compound of the present invention in a carrier-transporting material; only the luminescent copper coordination compound at 100% concentration; or the layer composed of the luminescent copper coordination compound as a main component with the addition of a small amount of additive (e.g. carrier-transporting material or crystallization-preventing material). Further, among guest host types, two carrier-transporting materials as guests, one having an electron-transporting property and the other having a hole-transporting property, are used, and the luminescent copper coordination compound can be added thereto. Therefore, the luminescent layer of the present invention can be composed of a material containing one or more components, considering performance improvement or productivity.

In addition, for the hole-transporting layer 13, triphenylamine derivatives (typical example is αNPD), for example, are mainly used. In the case of polymers, PVK is used. PVK has mainly hole-transporting property, and PVK itself exhibit blue EL luminescence.

As the electron-transporting layer 16, oxadiazole derivatives, for example, are used, or Alq, Bphen or BCP as shown below can be used.

[Chemical Formula 22]

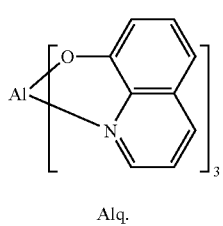

Alq.

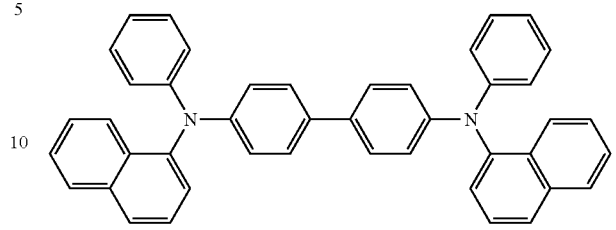

α-NPD

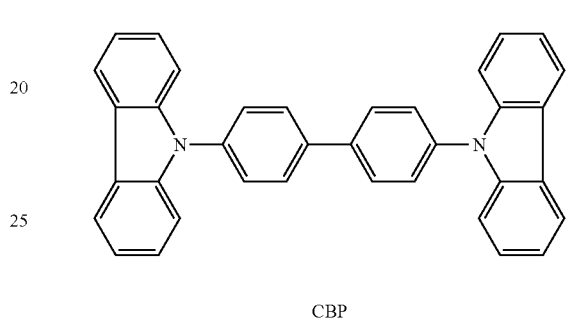

CBP

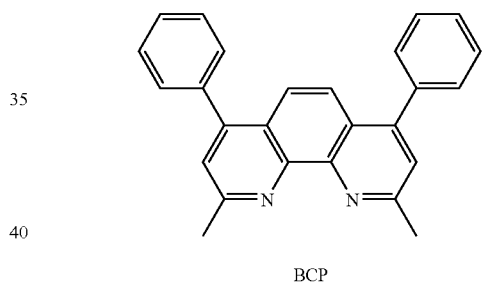

BCP

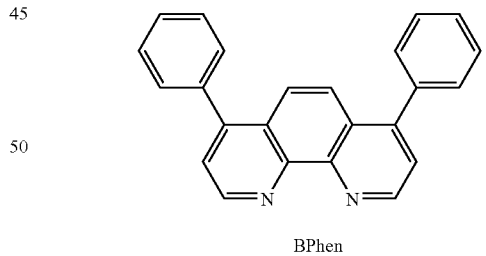

BPhen

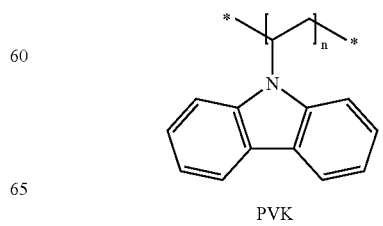

PVK

Production Example 1

Production of Exemplary Compound 1001

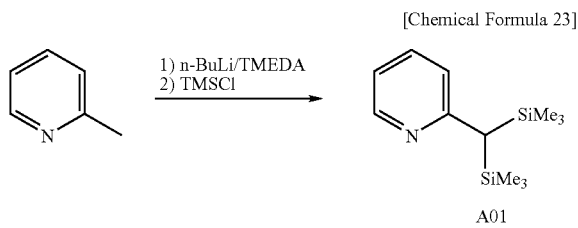
[Chemical Formula 23]

Into a 1000-ml flask, 32.6 g of TMEDA (281 mmol) was charged with 150 ml of cyclohexane, and cooled to −30° C. To this solution, 345 ml of n-butyl lithium (2.4 M hexane solution) was dropwise added with a cannular, and 26.1 g (281 mmol) of 2-methyl pyridine was dropwise added to the resultant suspended solution with a dropping funnel. Thereafter, the reaction solution was heated and stirred at room temperature for 10 minutes. Then, the solution was again cooled down to −30° C., and 91.5 g (843 mmol) of trimethylsilyl chloride was dropwise added thereto with a dropping funnel. After stirring for 15 minutes, the resultant solution was heated to room temperature, and stirred for 2 hours. After the reaction, the resultant mixture was treated with water, and extraction was carried out with hexane (1 L×3). An organic layer thereof was washed with saturated saline and dried on magnesium sulfate. Then, the solvent thereof was evaporated and a crude product was obtained. The obtained product was purified with column chromatography (ethyl acetate/hexane=1/10), and distilled under reduced pressure to obtain 13.0 g of Compound A01 (yield 19%).

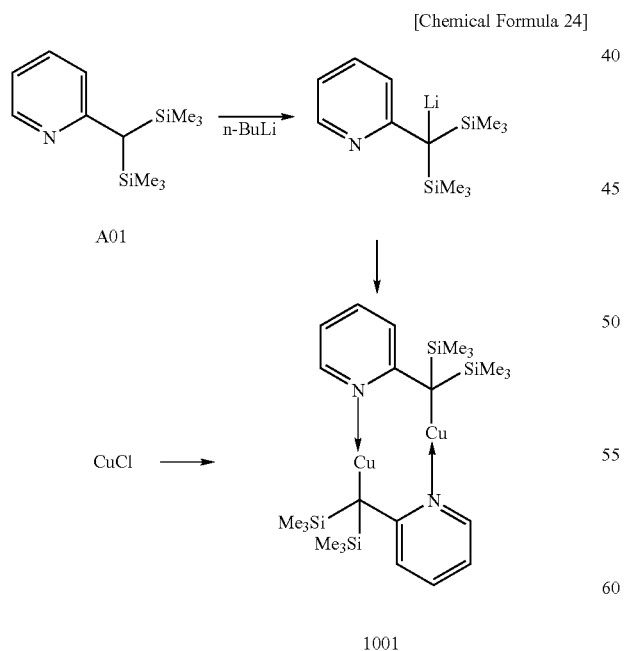
[Chemical Formula 24]

To a 100-ml two-necked flask, 952 mg of 2-(bis-trimethylsilanyl-methyl)-pyridine (Compound A01) was charged with 20 ml of completely degassed dehydrated tetrahydrofuran, and 2.5 ml of n-butyllithium (4 mmol, 1.6 M hexane solution) was dropwise added while stirring at −20° C. under nitrogen gas flow.

Thereafter, the resultant solution was heated gradually to room temperature. After the solution reached to room temperature, 496 mg (4 mmol) of copper chloride (I) was added thereto and the resultant mixture was stirred for 15 minutes. After the reaction was completed, the solvent thereof was evaporated in nitrogen atmosphere. 50 ml of dehydrated and degassed hexane was added to the reaction mixture and the mixture was stirred. Then, in nitrogen atmosphere insoluble matters were filtrated. The resultant filtrate was concentrated in nitrogen atmosphere, and the obtained solid product was purified by sublimation purification to obtain 350 mg (yield 29%) of Exemplary compound 1001.

Production Example 2

Production of Exemplary Compound 1002

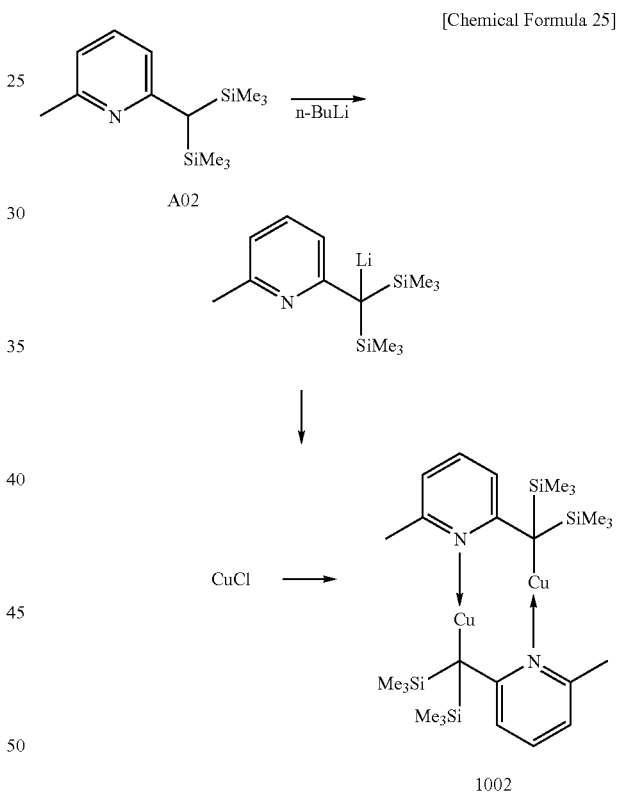
[Chemical Formula 25]

To a 100-ml two-necked flask, 1006 g (4 mmol) of 2-(bis-trimethylsilanyl-methyl)-6-methyl-pyridine (Compound A02) was charged with 20 ml of completely degassed and dehydrated tetrahydrofuran, and 2.5 ml of n-butyllithium (4 mmol, 1.6 M hexane solution) was dropwise added while stirring at −20° C. under nitrogen gas flow.

Thereafter, the resultant solution was heated gradually to room temperature. After the solution reached to room temperature, 496 mg (4 mmol) of copper chloride (I) was added thereto and the resultant mixture was stirred for 15 minutes. After the reaction was completed, the solvent thereof was evaporated in nitrogen atmosphere. To the reaction mixture 50 ml of dehydrated and degassed hexane was added, and the mixture was stirred. Then, in nitrogen atmosphere, insoluble matters were filtrated. The resultant filtrate was concentrated in nitrogen atmosphere, and the obtained solid product was purified by sublimation purification to obtain 390 mg (yield 31%) of Exemplary compound 1002.

Production Example 3

Production of Exemplary Compound 1176

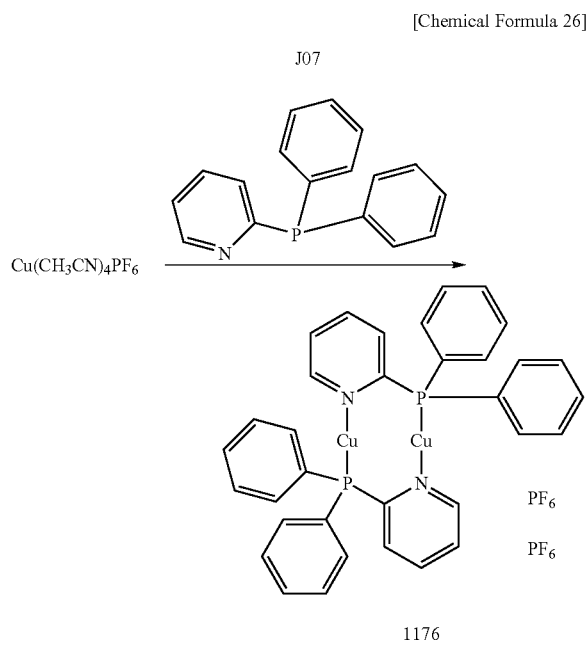

[Chemical Formula 26]

To a 100-ml two-necked flask, 186 mg (0.5 mmol) of tetrakis(acetonitrile)copper(I)hexafluorophosphate and 20 ml of dehydrated toluene were fed and 132 mg (0.5 mmol) of 2-diphenylphosphanyl-pyridine (Compound J07) was charged thereto under nitrogen gas flow. Thereafter, the mixture was stirred for 1 hour. After the reaction was completed, the solvent thereof was evaporated and recrystallization was carried out with chloroform/methanol to obtain 159 mg (yield 50%) of Exemplary compound 1176.

Luminescence Characteristics of Compounds

Figure 2:
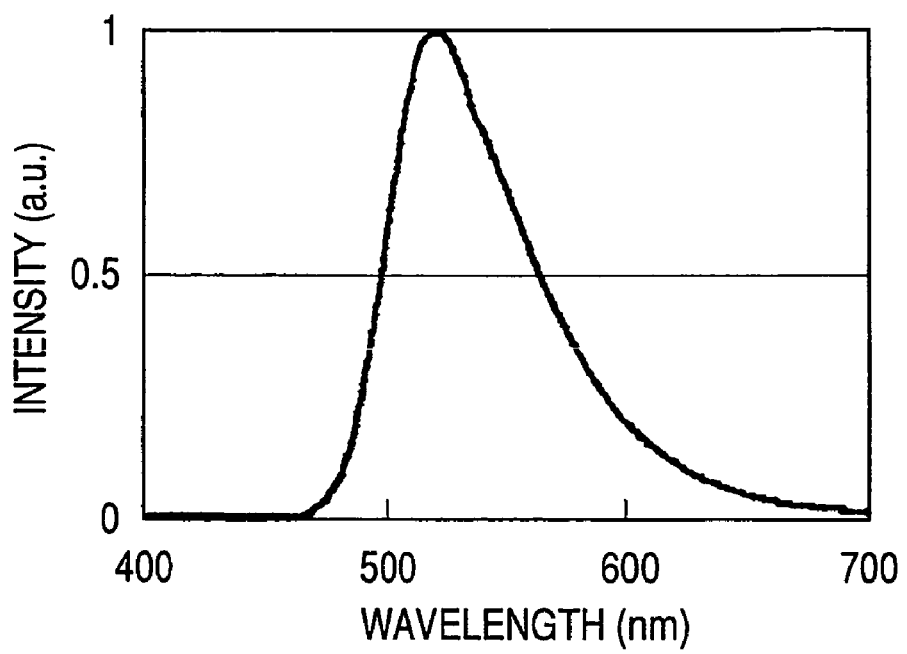
FIG. 2 is a graph showing a luminescence spectrum of an exemplary compound 1001.

Luminescence characteristics of compounds produced by Production Examples 1 to 3 were measured when these compounds were powder. Results thereof are shown in Table 8. In addition, a luminescence spectrum of Exemplary compound 1001 is shown in FIG. 2 as a representative example.

TABLE 8

| Exemplary Compound | Luminescence wavelength (nm) | Half-value width (nm) |
|---|---|---|
| 1001 | 519 | 67 |
| 1002 | 525 | 70 |
| 1176 | 514 | 91 |

Examples 1 and 2

In these examples, a device having a device structure including three organic layers as shown in FIG. 1D was used.

On a glass substrate (transparent substrate 15), 100 nm-thick ITO (transparent electrode 14) was patterned such that the resultant opposing electrodes had an area of 3 mm². The organic layers and the electrode layers described below were vacuum-deposited on the ITO substrate by resistive heating in a vacuum chamber at $10^{-4}$ Pa for continuous deposition. Two kinds of luminescent layer 12 having 40 nm (Example 1) and 20 nm (Example 2) in thickness were prepared.

Hole-transporting layer 13 (thickness: 40 nm): compound FL1

Luminescent layer 12 (thickness: 40 nm, 20 nm): CBP/Exemplary compound 1001 (10% by weight based on CBP)

Electron-transporting layer 16 (thickness: 50 nm): BPhen

Metal electrode 1 (thickness: 1 nm): KF Metal electrode 2 (thickness: 100 nm): Al The structural formula of Compound FL1 is shown below.

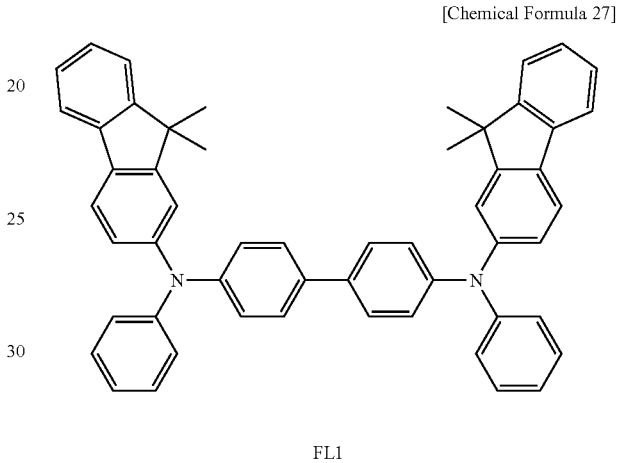

[Chemical Formula 27]

FL1

Example 3

In this Example, a device having the device structure including three organic layers shown in FIG. 1D was used.

On an ITO substrate as prepared in the same manner as in Example 1, PEDOT (for organic EL) available from Bayer Corporation was applied by spin coating at 1000 rpm (20 sec.) to a thickness of 40 nm as a hole-transporting layer 13, and dried for 1 hour in a vacuum chamber at 120° C.

On top of that layer, the following solution was used for spin-coating at 2000 rpm for 20 seconds in nitrogen atmosphere so that the luminescent layer 12 with a thickness of 50 nm was formed. The formed layer was dried in the same condition as in forming the hole-transporting layer 13.

Dehydrated chlorobenzene: 10 g
Polyvinyl carbazole (average molecular weight 9600): 92 mg
Exemplary compound 1001: 8 mg This substrate was installed in a vacuum deposition chamber, and Bphen was vacuum-deposited thereon to form an electron-transporting layer 16 with a thickness of 40 nm.

Then, a cathode electrode (metal electrode 11) having the following structure was formed.

Metal electrode layer 1 (thickness: 15 nm): AlLi alloy (Li content: 1.8% by weight)
Metal electrode layer 2 (thickness: 100 nm): Al Characteristics of Devices Characteristics of the device were evaluated by applying DC voltage to the metal electrode 11 as the negative side and the transparent electrode 14 as the positive side.

As for voltage-current characteristic, good rectification was exhibited. Luminescence spectrum and luminescence intensity were measured with spectrometers SR1 and BM7 manufactured by TOPCON Corporation. A current value at the time of voltage application was measured with 4140Bd manufactured by Hewlett-Packard Corporation. Luminescence efficiency cd/A was calculated based on luminescence intensity and the measured current value. The results are shown in Table 9.

TABLE 9

| Example | Luminescence wavelength (nm) | 300 cd | | 600 cd | |
|---|---|---|---|---|---|
| | | cd/A | lm/w | cd/A | Lm/W |
| 1 | 535 | 20.7 | 10.1 | 18.1 | 9.2 |
| 2 | 535 | 24.9 | 17.8 | 21.4 | 14.5 |
| 3 | 540 | 11.5 | 5.2 | 10.1 | 4.3 |

The device exhibited excellent luminescence at 300 and 600 cd/cm$^2$.

In Example 1, the external quantum efficiency was 7.5% and highly efficient luminescent device was obtained taking advantage of luminescence through a triplet excited state. Further, the devices of Examples 1 and 2 were energized for 100 hours for luminescence. It was confirmed that stable luminescence was obtained at that time.

Example 4

Figure 3:
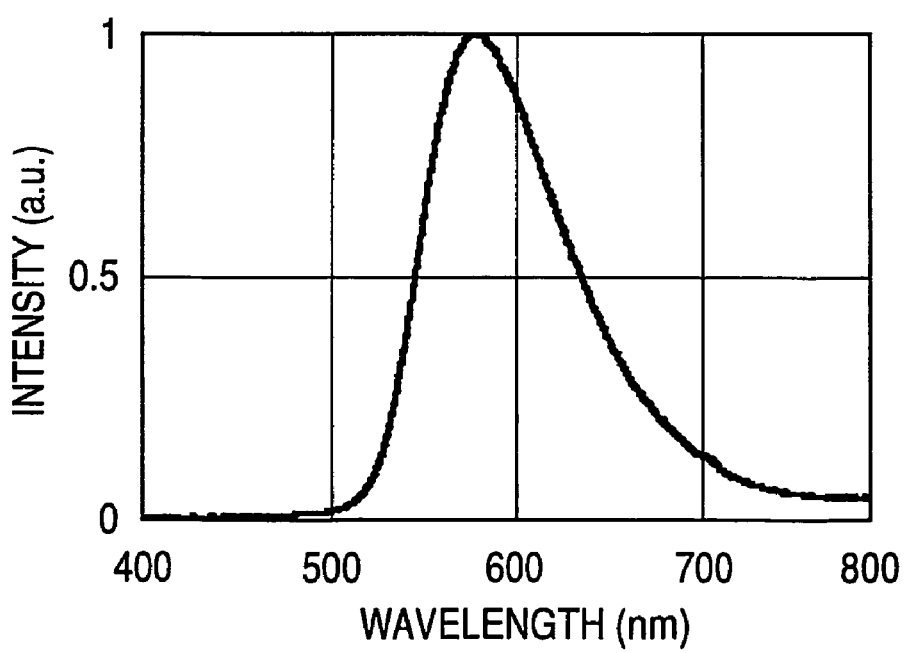
FIG. 3 is a graph showing a luminescence spectrum of a compound in a solid state in the present Example.

Using the same synthesis method as shown in Production Example 1, Exemplary compound 1078 was synthesized based on the following synthesis scheme. After the reaction between a ligand and CuCl, sublimation purification was carried out to obtain a compound in a synthesis yield of 10%. To identify the compound, elemental analysis and X-ray crystal analysis were employed. FIG. 3 shows a luminescence spectrum of the compound of this example in a solid state. A strong orange luminescence was observed from the compound, which had a peak wavelength at 577 nm and a half-value width of 91 nm.

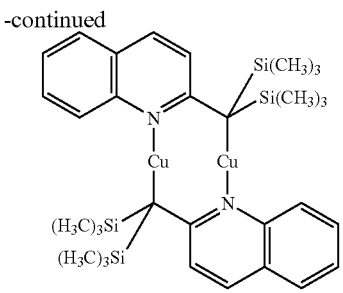

Example 5

Exemplary compound 1007 was synthesized based on the following synthesis scheme.

To a 300-ml reaction vessel, diisopropylamine (14 ml, 99 mmol) and diethylether (100 ml) were fed and cooled down to −40° C. To this mixture solution, n-butyllithium in 2.44 M hexane solution (41 ml, 99 mmol) was added dropwise. The mixture solution was warmed to 0° C. while stirring, and then cooled down to −78° C. Then, 2-fluoro-6-methyl pyridine (5.0 g, 45 mmol) was added thereto. After stirring for 15 minutes, trimethylsilyl chloride (12.6 ml, 99 mmol) was slowly added dropwise. Thereafter, the resultant solution was warmed and stirred at room temperature for 18 hours. To this mixture solution, water and further hexane (150 ml) were added, and the mixture was separated to an organic layer and an aqueous layer. Then, the aqueous layer was extracted with hexane for collecting the organic layer. The collected organic layer was washed with saturated saline and dried on MgSO$_4$. This solution was concentrated to obtain a light brown liquid of ligand.

The synthesis method for obtaining a copper coordination compound is the same as in Production Example 1 of reaction between a ligand and CuCl. The reaction between the ligand and CuCl is followed by sublimation purification to obtain the compound in a synthesis yield of 20%. To identify the compound, elemental analysis and X-ray crystal analysis were employed.

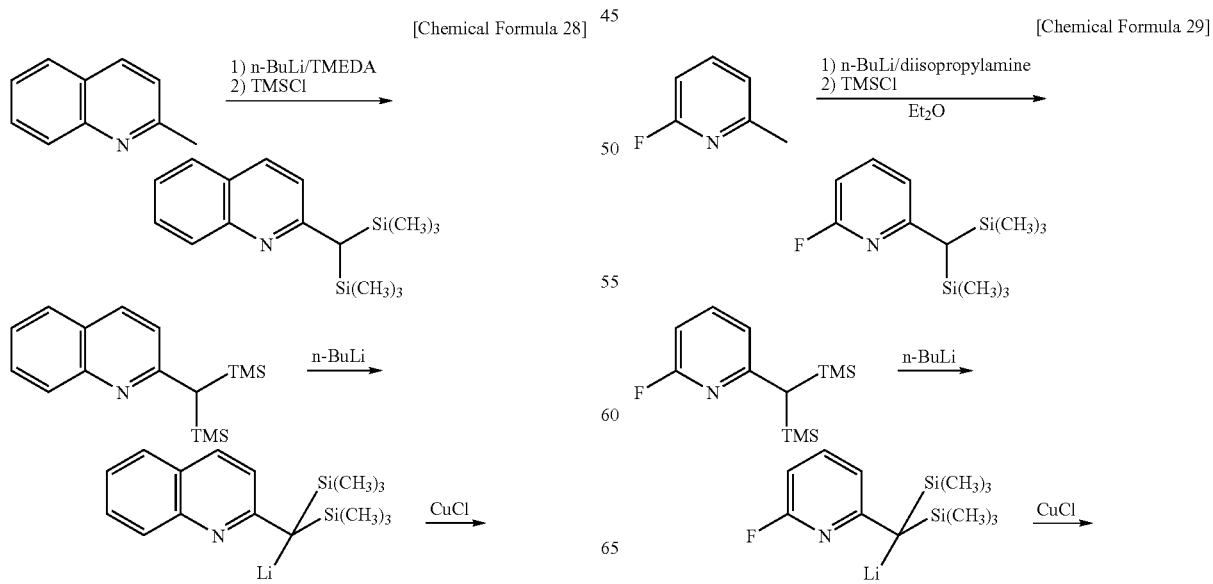

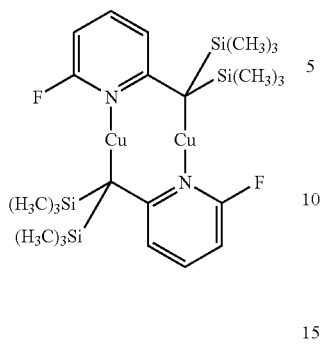

Figure 4:
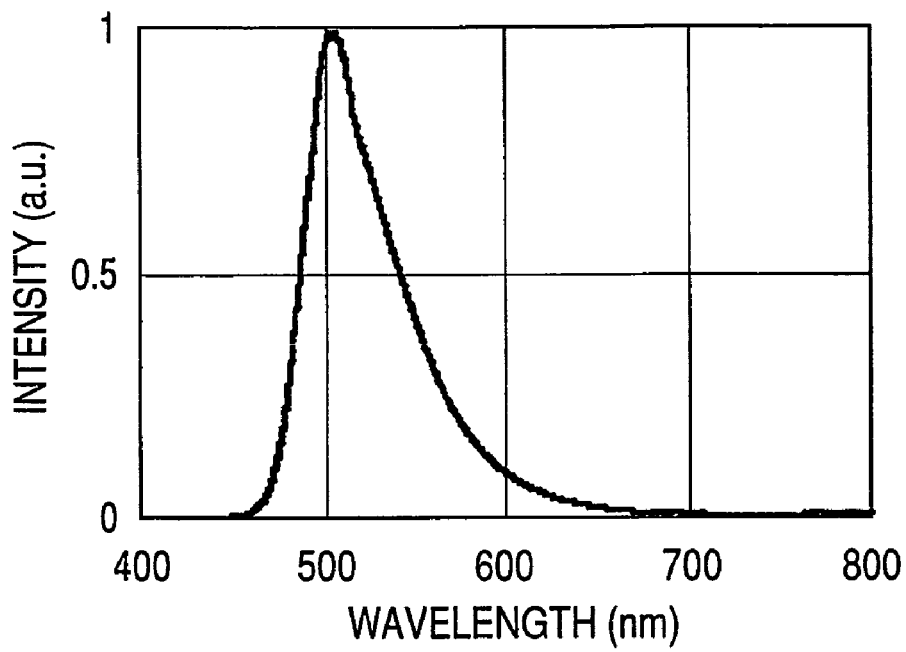
FIG. 4 is a graph showing a luminescence spectrum of a compound in a solid state in the present Example.

FIG. 4 shows a luminescence spectrum of the compound of this example in a solid state. A strong green luminescence was observed from the compound, which had a peak wavelength at 504 nm and a half-value width of 55 nm.

Example 6

Exemplary compound 3002 as the metal coordination compound was synthesized based on the following synthesis scheme. A ligand was obtained by reaction between trimethylsilyl diphenylphosphine and 1-iodine-2-bromobenzene in the presence of palladium catalyst in a benzene solvent. The method for obtaining a copper coordination compound was the same as in Production Example 1 of reaction between a ligand and CuCl. The reaction between the ligand and CuCl was carried out to obtain the compound in a synthesis yield of 12%. To identify the compound, elemental analysis and X-ray crystal analysis were employed.

[Chemical Formula 29]

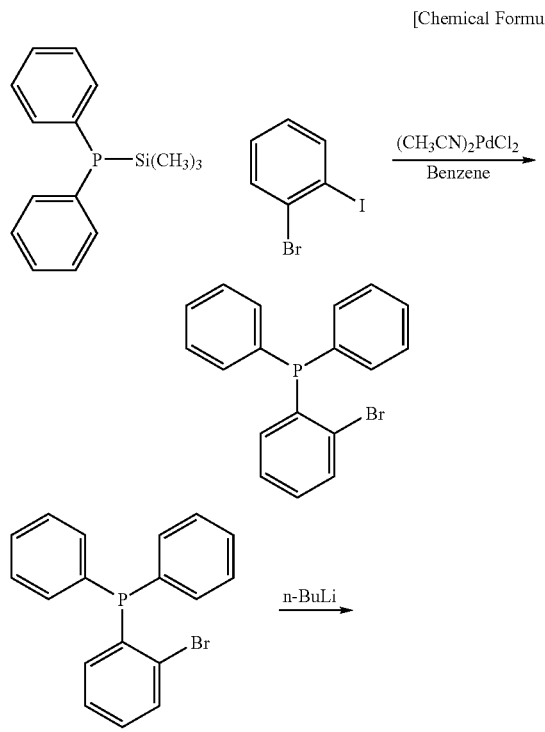

Figure 5:
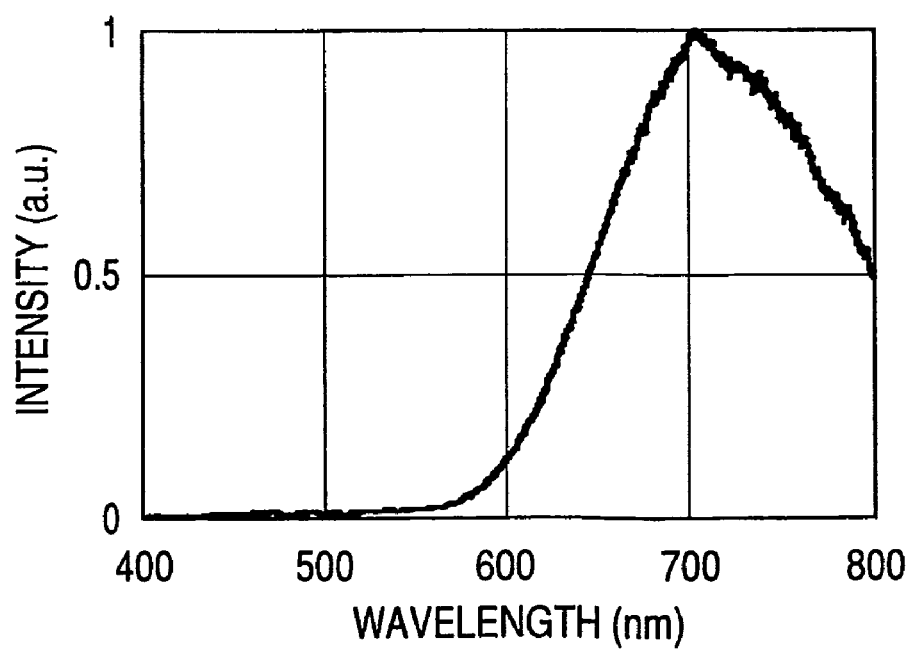
FIG. 5 is a graph showing a luminescence spectrum of a compound in a solid state in the present Example.

FIG. 5 shows a luminescence spectrum of the compound of this example in a solid state. A red luminescence was observed from the compound, which had a peak wavelength of 705 nm.

Examples 7 and 8

In Examples 7 and 8, the device having the same device structure as in Example 2 was produced except for a luminescent layer. These examples employed the same Exemplary compound 1001 as a luminescent dopant as in Example 2, but the concentration thereof was changed so that the device of Example 7 had a luminescent layer with 50% concentration of the Exemplary compound 1001 and 50% concentration of CBP and the device of Example 8 had a luminescent layer with 100% concentration of the Exemplary compound 1001. The thickness of the luminescent layer was 20 nm.

After the production of the devices, characteristics of the devices were evaluated. The results thereof are shown in the following table, which shows the efficiency at 60.0 cd/m$^2$ of luminance.

TABLE 10

| | Luminescence wavelength (nm) | cd/A | 1m/W |
|---|---|---|---|
| Example 7 | 540 | 19.3 | 13.2 |
| Example 8 | 550 | 19.0 | 12.0 |

As shown above, these Examples exhibited an efficiency comparable with Example 2 wherein the concentration of the Exemplary compound 1001 in the luminescent layer was 10%. Thus, it is understood that Exemplary compound 1001 is a luminescent material that prevents concentration quenching, that is no decrease of efficiency, even when the concentration thereof is high. Further, stable luminescence was exhibited even when continuous luminescence was performed at 300 cd/m$^2$.

Examples 9, 10 and 11

In Examples 9 to 11, the devices having the same structure as in Examples 1 and 2 except that Exemplary compound 1007 was used as a luminescent dopant. In the luminescent layer, the Exemplary compound 1007 had a concentration of 10% by weight, and the thicknesses of the luminescent layer were 40 nm (Example 9) and 20 nm (Example 10). Further, the luminescent layer of Example 11 had a thickness of 20 nm and was composed of only Exemplary compound 1007 without CBP.

TABLE 11

|  | Luminescence wavelength (nm) | cd/A | lm/W |
|---|---|---|---|
| Example 9 | 505 | 10.2 | 6.8 |
| Example 10 | 505 | 15.0 | 11.0 |
| Example 11 | 515 | 12.0 | 8.2 |

As shown above, the device using the Exemplary compound 1007 exhibited high luminescence efficiency. It is understood that the Exemplary compound 1007 is an excellent luminescent dopant. Further, the device of Example 11 having the luminescent layer of 100% Exemplary compound 1007 exhibited good efficiency. It is thus understood that the Exemplary compound 1007 is a luminescent material that prevents concentration quenching. Stable luminescence was exhibited even when continuous luminescence was performed at 300 cd/m$^2$.

Example 12

In Example 12, the device having the same device structure as in Example 3, except that Exemplary compound 1176 synthesized in Production Example 3 was used instead of Exemplary compound 1001.

TABLE 12

|  | Luminescence wavelength (nm) | cd/A | lm/W |
|---|---|---|---|
| Example 12 | 520 | 4.3 | 2.0 |

High luminescence efficiency was confirmed and also stable luminescence was exhibited even when continuous luminescence was performed at 300 cd/m$^2$.

This application claims priority from Japanese Patent Application Nos. 2003-401821 filed on Dec. 1, 2003 and 2004-298501 filed on Oct. 13, 2004, which are hereby incorporated by reference herein.

The invention claimed is:

1. A luminescent device comprising:
a pair of electrodes consisting of a first electrode and a second electrode, a luminescent layer having an organic compound disposed between said pair of electrodes, a first organic compound layer between said first electrode and said luminescent layer and a second organic compound layer between said second electrode and said luminescent layer,
wherein said luminescent layer has a host material and a guest material, said guest material being a copper coordination compound represented by the following

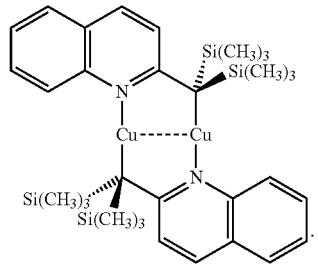

* * * * *